United States Patent
In et al.

(10) Patent No.: US 12,527,184 B2
(45) Date of Patent: Jan. 13, 2026

(54) LIGHT EMITTING DISPLAY DEVICE

(71) Applicant: Samsung Display Co., LTD., Yongin-si (KR)

(72) Inventors: Yun-Kyeong In, Yongin-si (KR); Seoyeong Kim, Yongin-si (KR); Seung Woo Sung, Yongin-si (KR); Jun Young Jo, Yongin-si (KR); Won Se Lee, Yongin-si (KR); Ji-Eun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 488 days.

(21) Appl. No.: 18/172,230

(22) Filed: Feb. 21, 2023

(65) Prior Publication Data

US 2024/0032356 A1    Jan. 25, 2024

(30) Foreign Application Priority Data

Jul. 21, 2022  (KR) .......... 10-2022-0090533

(51) Int. Cl.
| | |
|---|---|
| *H10K 59/131* | (2023.01) |
| *H10K 39/34* | (2023.01) |
| *H10K 59/121* | (2023.01) |
| *H10K 59/126* | (2023.01) |
| *H10K 59/60* | (2023.01) |
| *H10K 59/65* | (2023.01) |

(52) U.S. Cl.
CPC ......... *H10K 59/131* (2023.02); *H10K 59/126* (2023.02)

(58) Field of Classification Search
CPC .. H10K 59/126; H10K 59/131; H10K 59/121; H10K 59/1213; H10K 59/65
See application file for complete search history.

(56) References Cited

U.S. PATENT DOCUMENTS

| | | | |
|---|---|---|---|
| 2005/0242745 A1* | 11/2005 | Jung | H10D 86/60 313/496 |
| 2006/0043366 A1 | 3/2006 | Ha et al. | |
| 2007/0080417 A1* | 4/2007 | Jung | H10K 59/13 257/448 |
| 2018/0182834 A1* | 6/2018 | Toyotaka | H10D 86/481 |
| 2020/0258966 A1* | 8/2020 | Cha | H10D 86/423 |
| 2022/0102390 A1* | 3/2022 | Lee | G02F 1/16756 |
| 2022/0139965 A1* | 5/2022 | Lee | H10D 86/421 257/72 |
| 2022/0285469 A1* | 9/2022 | Park | H10K 59/124 |

FOREIGN PATENT DOCUMENTS

| | | |
|---|---|---|
| CN | 109375437 A | 2/2019 |
| KR | 10-1130903 B1 | 3/2012 |
| KR | 10-1640192 B1 | 7/2016 |
| KR | 10-2021-0108536 A | 9/2021 |

* cited by examiner

*Primary Examiner* — Mohsen Ahmadi
(74) *Attorney, Agent, or Firm* — Womble Bond Dickinson (US) LLP

(57) ABSTRACT

A light emitting display device includes: a display panel including: a display area; and a first pixel and a second pixel at the display area; and an optical element on a rear surface of the second pixel. The second pixel includes: a photosensor area; and a shielding layer at the photosensor area, the shielding layer being transparent and conductive.

10 Claims, 27 Drawing Sheets

(A)

(B)

LIGHT EMITTING DISPLAY DEVICE

CROSS-REFERENCE TO RELATED APPLICATION

This application claims priority to and the benefit of Korean Patent Application No. 10-2022-0090533, filed in the Korean Intellectual Property Office on Jul. 21, 2022, the entire content of which is incorporated by reference herein.

BACKGROUND

1. Field

Aspects of embodiments of the present disclosure relate to a light emitting display device.

2. Description of the Related Art

A display device is a device for displaying an image, and includes a liquid crystal display (LCD), an organic light emitting diode (OLED) display, and the like. The display device is used in various electronic devices, such as a mobile phone, a navigation device, a digital camera, an electronic book, a portable game machine, and various terminals.

The display device, such as the organic light emitting device, may have a structure in which the display device may be bent or folded using a flexible substrate.

In addition, in small electronic devices, such as the mobile phone, optical elements, such as cameras and optical sensors, may be formed in the bezel area, which is the periphery of the display area.

The above information disclosed in this Background section is for enhancement of understanding of the background of the present disclosure, and therefore, it may contain information that does not constitute prior art.

SUMMARY

As the size of the peripheral area of the display area is gradually being reduced, while the size of the display screen is increased, technology is being developed that allows the camera or the optical sensor to be positioned on the rear surface of the display area.

One or more embodiments of the present disclosure are directed to a display device having a reduced area of the non-display area that is positioned around the display area.

One or more embodiments of the present disclosure are directed to a display device having improved display quality.

One or more embodiments of the present disclosure are directed to a display device in which a display deterioration thereof may be prevented or reduced.

According to one or more embodiments of the present disclosure, a light emitting display device includes: a display panel including: a display area; and a first pixel and a second pixel at the display area; and an optical element on a rear surface of the second pixel. The first pixel includes: a first semiconductor layer on a substrate; a first gate conductive layer on the first semiconductor layer; a second gate conductive layer on the first gate conductive layer; an oxide semiconductor layer on the second gate conductive layer, and including a shielding layer; a third gate conductive layer on the oxide semiconductor layer; a first data conductive layer on the third gate conductive layer; and a second data conductive layer on the first data conductive layer, the second data conductive layer of the first pixel including a data line, and a main auxiliary data line extending in a direction parallel to that of the data line. The second pixel includes: the first semiconductor layer on the substrate; the first gate conductive layer on the first semiconductor layer; the second gate conductive layer on the first gate conductive layer; the oxide semiconductor layer on the second gate conductive layer, and including the shielding layer; the third gate conductive layer on the oxide semiconductor layer; the first data conductive layer on the third gate conductive layer; and the second data conductive layer on the first data conductive layer, the second data conductive layer of the second pixel including a data line, and not including a main auxiliary data line.

In an embodiment, the shielding layer may be transparent and conductive.

In an embodiment, the data line of the second pixel may have a structure that may be symmetrically bent together with a structure of an adjacent data line, and a photosensor area may be located in an area defined by the symmetrically bent structures.

In an embodiment, the data line of the first pixel may extend in one direction, and may have an unbent structure.

In an embodiment, the data line of the first pixel may include a pair of data lines facing each, and the main auxiliary data line may be located at opposite sides of the pair of data lines.

In an embodiment, the first semiconductor layer included in each of the first pixel and the second pixel may include a first region, a channel, and a second region of a corresponding driving transistor, and the shielding layer included in each of the first pixel and the second pixel may overlap with the first region of the corresponding driving transistor in a plan view.

In an embodiment, the data line of the first pixel may include a pair of data lines, the main auxiliary data line may include a pair of main auxiliary data lines, and the shielding layer included in the first pixel may overlap with the pair of data lines and the pair of main auxiliary data lines.

In an embodiment, the shielding layer included in the second pixel may overlap with the photosensor area.

In an embodiment, the first data conductive layer included in the first pixel may include an additional auxiliary data line, and the additional auxiliary data line may have an extension direction crossing the extension direction of the data line and the main auxiliary data line.

In an embodiment, the first data conductive layer included in the second pixel may include an additional auxiliary data line.

According to one or more embodiments of the present disclosure, a light emitting display device includes: a display panel including: a display area; and a first pixel and a second pixel at the display area; and an optical element on a rear surface of the second pixel. The second pixel includes: a photosensor area; and a shielding layer at the photosensor area, the shielding layer being transparent and conductive.

In an embodiment, the shielding layer may be a plasma-treated or doped portion of an oxide semiconductor layer to be conductive.

In an embodiment, the shielding layer may include a transparent conductive material.

In an embodiment, the first pixel may include: a first semiconductor layer on a substrate; a first gate conductive layer on the first semiconductor layer; a second gate conductive layer on the first gate conductive layer; an oxide semiconductor layer on the second gate conductive layer, and including the shielding layer; a third gate conductive layer on the oxide semiconductor layer; a first data conductive layer on the third gate conductive layer; and a second data conductive layer on the first data conductive layer, the second data conductive layer of the first pixel including a data line, and a main auxiliary data line extending in a direction parallel to the data line. The second pixel may include: the first semiconductor layer on the substrate; the first gate conductive layer on the first semiconductor layer; the second gate conductive layer on the first gate conductive layer; the oxide semiconductor layer on the second gate conductive layer, and including the shielding layer; the third gate conductive layer on the oxide semiconductor layer; the first data conductive layer on the third gate conductive layer; and the second data conductive layer on the first data conductive layer, the second data conductive layer of the second pixel including a data line, and not including a main auxiliary data line.

In an embodiment, the data line of the second pixel may have a structure that may be symmetrically bent together with a structure of an adjacent data line, and the photosensor area may be located in an area defined by the symmetrically bent structures. The data line of the first pixel may extend in one direction, may have an unbent structure, and may include a pair of data lines facing each other, and the main auxiliary data line may be located at opposite sides of the pair of data lines.

In an embodiment, the first semiconductor layer included in each of the first pixel and the second pixel may include a first region, a channel, and a second region of a corresponding driving transistor; and the shielding layer included in each of the first pixel and the second pixel may overlap with the first region of the corresponding driving transistor in a plan view.

In an embodiment, the data line of the first pixel may include a pair of data lines, the main auxiliary data line may include a pair of main auxiliary data lines, and the shielding layer included in the first pixel may overlap with the pair of data lines and the pair of main auxiliary data lines.

In an embodiment, the shielding layer included in the second pixel may overlap with the photosensor area.

In an embodiment, the first data conductive layer included in the first pixel may include an additional auxiliary data line, and the additional auxiliary data line may have an extension direction crossing the extension direction of the data line and the main auxiliary data line.

In an embodiment, the first data conductive layer included in the second pixel may include an additional auxiliary data line.

According to one or more embodiments of the present disclosure, the area of the non-display area may be reduced by positioning the sensor on the rear surface of the display area.

According to one or more embodiments of the present disclosure, a wiring for transmitting the data voltage may reduce a width of the fan-out portion connected to the driving chip, thereby reducing the area of the non-display area.

According to one or more embodiments of the present disclosure, the pixel positioned on the front of the sensor may be formed differently from the normal pixel, but the pixel positioned on the front of the sensor may not display a luminance differently from that of the normal pixel, so that the boundary may not be recognized and the display quality may be improved.

According to one or more embodiments of the present disclosure, by forming the shielding layer between the driving transistor and the wiring through which the data voltage is transmitted, characteristics of the driving transistor may not be changed, so that display quality may not be deteriorated.

BRIEF DESCRIPTION OF THE DRAWINGS

The above and other aspects and features of the present disclosure will be more clearly understood from the following detailed description of the illustrative, non-limiting embodiments with reference to the accompanying drawings.

DETAILED DESCRIPTION

Figure 1:
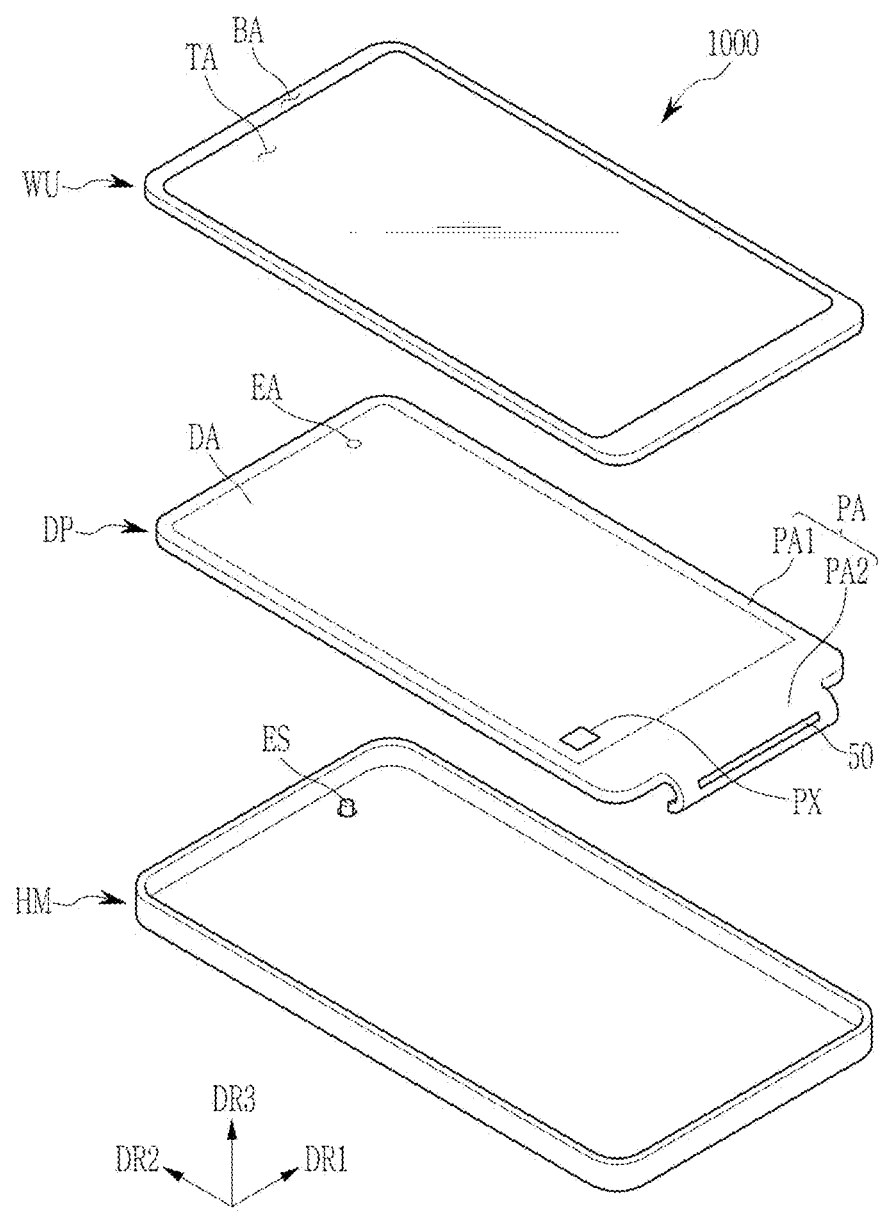
FIG. 1 is an exploded perspective view of a display device according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

As used herein, the phrases "on a plane" or "in a plan view" may refer to a view of the object portion from the top, and the phrases "on a cross-section" or "in a cross-sectional view" may refer to a view of a cross-section of an object portion in which the object portion is vertically cut from the side.

Further, a part, such as wires, layers, films, areas, plates, and constituent elements, are described as being "extended in the first direction or second direction", the part may extend not only in a straight-line shape in the corresponding direction, but may be a structure that extends overall along the first direction or the second direction, such as a structure that is bent and/or has a zigzag structure at least in a part, or may be a structure extending while including a curved line structure.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

First, a schematic structure of a display device is described in more detail with reference to FIG. 1 and FIG. 2.

FIG. 1 is an exploded perspective view of a display device according to an embodiment.

Referring to FIG. 1, a light emitting display device 1000 according to an embodiment is a device for displaying a motion picture and/or a still image. The display device 1000 may be used as a display screen of various suitable products, such as a television, a laptop, a monitor, an advertisement board, Internet of things (IOT) devices, and the like, as well as for portable electronic devices, such as a mobile phone, a smart phone, a tablet personal computer, a mobile communication terminal, an electronic notebook, an e-book, a PMP (portable multimedia player), a navigation device, a UMPC (Ultra Mobile PC), and the like. In addition, the display device 1000 according to an embodiment may be used in a wearable device, such as a smart watch, a watch phone, a glasses display, and a head mounted display (HMD). In addition, the display device 1000 according to an embodiment may be used as an instrument panel of a car, a center fascia of the car, or a CID (Center Information Display) disposed on a dashboard, a room mirror display that replaces a side mirror of the car, an entertainment device for a rear seat of the car, or a display disposed on the rear surface of the front seat. FIG. 1 illustrates the display device 1000 in the context of a smartphone for convenience of illustration and ease of comprehension, but the present disclosure is not limited thereto.

The display device 1000 may display an image in a third direction DR3 on a display surface parallel to or substantially parallel to each of a first direction DR1 and a second direction DR2. The display surface on which the image is displayed may correspond to the front surface of the display device 1000, and may correspond to the front surface of a cover window WU. The images may include static images, as well as dynamic images.

In the present embodiment, a front surface (e.g., an upper surface) and a rear surface (e.g., a lower surface) of each member are defined based on the direction in which the image is displayed. The front surface and the rear surface may be opposite to each other in the third direction DR3, and the normal directions of each of the front and the rear surfaces may be parallel to or substantially parallel to the third direction DR3. A separation distance in the third direction DR3 between the front surface and the rear surface may correspond to the thickness of the display panel in the third direction DR3.

The display device 1000 according to an embodiment may detect an input (e.g., such as from a hand) of a user applied from the outside. The input of the user may include various suitable kinds of external inputs, such as a part of the user's body, light, heat, or pressure. The user's input may be provided in various suitable forms, and the display device 1000 may sense the user's input applied to the front surface, a side surface, and/or the rear surface of the display device 1000 according to the structure of the display device 1000.

Figure 2:
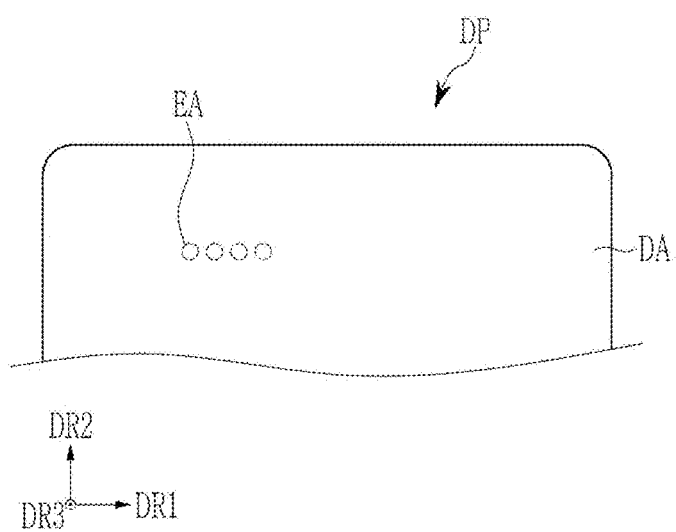
FIG. 2 is a top plan view illustrating an enlarged partial region of a light emitting display device according to an embodiment.

Referring to FIG. 1 and FIG. 2, the display device 1000 may include the cover window WU, a housing HM, a display panel DP, and an optical element ES. In an embodiment, the cover window WU and the housing HM may be combined with each other to constitute the appearance of the display device 1000.

The cover window WU may include an insulating panel. For example, the cover window WU may include (e.g., may be made of) glass, plastic, or a suitable combination thereof.

The front surface of the cover window WU may define the front surface of the display device 1000. The cover window WU may include a transmissive area TA and a blocking area BA. The transmissive area TA may be an optically transparent area. For example, the transmissive area TA may be an area having visible ray transmittance of about 90% or more.

The blocking area BA may define the shape of the transmissive area TA. The blocking area BA is adjacent to the transmissive area TA, and may surround (e.g., around a periphery of) the transmissive area TA. The blocking area BA may be an area having relatively low light transmittance compared to that of the transmissive area TA. The blocking area BA may include an opaque material that blocks light. The blocking area BA may have a suitable color (e.g., a predetermined color). The blocking area BA may be defined by a bezel layer provided separately from a transparent substrate defining the transmissive area TA, or may be defined by an ink layer formed by inserting or coloring the blocking area BA into the transparent substrate.

The display panel DP may display an image, and may include a driving part (e.g., a driver) 50, and a display pixel PX that is positioned within the display area DA. The display panel DP may include the front surface including a display area DA and a non-display area PA. The display area DA may be an area in which the display pixel PX operates and emits light according to an electrical signal, and includes the display pixel PX. In an embodiment, the display area DA is an area at (e.g., in or on) which the image is displayed, and including the pixel. The display area DA, may also be an area in which an external input is sensed by positioning a touch sensor on the upper side of the pixel in the third direction DR3.

The transmissive area TA of the cover window WU may at least partially overlap with the display area DA of the display panel DP. For example, the transmissive area TA may overlap with the front surface of the display area DA, or may overlap with at least a portion of the display area DA. Accordingly, the user may recognize the image through the transmissive area TA, or may provide the external input based on the image. However, the present disclosure is not limited thereto. For example, an area in which the image is displayed and an area in which the external input is detected may be separated from each other at (e.g., in or on) the display area DA.

The non-display area PA of the display panel DP may at least partially overlap with the blocking area BA of the cover window WU. The non-display area PA may be an area covered by the blocking area BA. The non-display area PA may be adjacent to the display area DA, and may surround (e.g., around a periphery of) the display area DA. An image is not displayed in the non-display area PA, and a driving circuit or driving wiring for driving the display area DA may be disposed at (e.g., in or on) the non-display area PA. The non-display area PA may include a first peripheral area PA1 positioned outside the display area DA, and a second peripheral area PA2 including the driving part 50, connection wiring, and a bending area. In the embodiment illustrated in FIG. 1, the first peripheral area PA1 is positioned on three sides of the display area DA, and the second peripheral area PA2 is positioned on another side (e.g., a fourth side) of the display area DA.

In an embodiment, the display panel DP may be assembled in a flat or substantially flat state, in which the display area DA and the non-display area PA face the cover window WU. However, the present disclosure is not limited thereto. A part of the non-display area PA of the display panel DP may be bent. In this case, a portion of the non-display area PA faces the rear surface of the display device 1000, so that the blocking area BA that may be visible from the front surface of the display device 1000 may be reduced. As shown in FIG. 2, the second peripheral area PA2 may be bent to be positioned on the rear surface of the display area DA, and then assembled.

Also, the display area DA of the display panel DP may include a component area EA, and the component area EA may be at least partially surrounded (e.g., around a periphery thereof) by the display area DA. A plurality of component area EAs may be included, and the component area EA may be an area in which a component using infrared rays, visible rays, or sound is disposed thereunder.

The display area DA includes a plurality of light emitting diodes (LEDs), and a plurality of pixel circuit parts for generating and transmitting a light emitting current to the plurality of light emitting diodes (LEDs). Here, one light emitting diode LED and one pixel circuit part are referred to as the pixel PX. The pixel circuit parts and the light emitting diodes LED are formed to have one-to-one correspondence with each other at (e.g., in or on) the display area DA.

The component area EA may include a transmissive part through which light and/or sound may pass, and a display unit including a plurality of pixels. The transmissive part is positioned between adjacent pixels, and includes a transparent layer through which light and/or sound may pass. The display unit may be formed to have one unit structure by adding a plurality of pixels, and the transmissive part may be positioned between the adjacent unit structures. According to an embodiment, a layer through which light is not transmitted, such as a light blocking member, may overlap with the component area EA.

According to an embodiment, the display panel DP may further include a touch sensor, in addition to the display area DA including the display pixel PX. The display panel DP may be visually recognized by the user from the outside through the transmissive area TA including the pixel that generates the image. In addition, the touch sensor may be positioned on the pixel, and may detect the external input applied from the outside. The touch sensor may detect the external input provided to the cover window WU.

The second peripheral area PA2 may include a bending part. The display area DA and the first peripheral area PA1 may have a flat or substantially flat state that is parallel to or substantially parallel to the plane defined by the first direction DR1 and the second direction DR2. One side of the second peripheral area PA2 may extend from the flat or substantially flat state, and may have the flat or substantially flat state again after going through the bending part. At least a part of the second peripheral area PA2 may be bent and assembled to be positioned on the rear surface side of the display area DA. At least a portion of the second peripheral area PA2 overlaps with the display area DA on a plane (e.g., in a plan view) when being assembled, so that the blocking area BA of the display device 1000 may be reduced. However, the present disclosure is not limited thereto. For example, the second peripheral area PA2 may not be bent.

The driving part 50 may be mounted on the second peripheral area PA2, and may be mounted on the bending part, or positioned on one of both sides of the bending part. The driving part 50 may be provided in the form of a chip.

The driving part 50 may be electrically connected to the display area DA to transmit an electrical signal to the display area DA. For example, the driving part 50 may provide data signals to the pixels PX disposed at (e.g., in or on) the display area DA. As another example, the driving part 50 may include a touch driving circuit, and may be electrically connected to the touch sensor disposed at (e.g., in or on) the display area DA. The driving part 50 may include various circuits, in addition to the above-described circuits, to provide various electrical signals to the display area DA.

A pad part may be positioned at the end of the second peripheral area PA2, and the display device 1000 may be electrically connected to a flexible printed circuit board (FPCB) including a driving chip by the pad part. Here, the driving chip positioned on the flexible printed circuit board may include various driving circuits for driving the display device 1000, or connectors for power supply. According to an embodiment, instead of the flexible printed circuit board, a rigid printed circuit board (PCB) may be used.

The optical element ES is disposed under the display panel DP, and overlaps with the component area EA. The optical element ES may use infrared rays, and in this case, a layer, such as a light blocking member, through which light does not transmit may overlap with the component area EA.

The optical element ES may be an electronic element using light or sound. For example, the optical element ES may be a sensor that receives and uses light, such as an infrared sensor, a sensor that outputs and senses light or sound to measure a distance or recognize a fingerprint, a small lamp that outputs light, a speaker that outputs sound, or the like. In the case of the electronic element that uses light, light of various suitable wavelength bands may be used, such as visible light, infrared light, and/or ultraviolet light. The optical element ES may include a light emitting portion and a light receiving portion.

According to an embodiment, the optical element ES may be at least one of a camera, an infrared camera (IR camera), a dot projector, an infrared illuminator, or a time-of-flight sensor (ToF sensor).

According to an embodiment, the optical element ES may additionally include a light sensing sensor or a thermal sensing sensor. The optical element ES may detect an external object received through the front surface, or may provide a sound signal, such as a voice, through the front surface to the outside. Also, the optical element ES may include a plurality of suitable configurations, and is not limited to any particular embodiment.

Still referring to FIG. 1, the housing HM may be combined with the cover window WU. The cover window WU may be disposed at the front of the housing HM. The housing HM may be combined with the cover window WU to provide a suitable accommodation space (e.g., a predetermined accommodation space). The display panel DP and the optical element ES may be accommodated in the accommodation space provided between the housing HM and the cover window WU.

The housing HM may include a material having a relatively high stiffness. For example, the housing HM may include a plurality of frames and/or plates made of glass, plastic, or metal, or a suitable combination thereof. The housing HM may reliably protect the components of the light emitting display device 1000 that is housed in the accommodation space from external impacts.

According to an embodiment, the display device 1000 may be a foldable display device, and may have a folding structure based on a folding axis.

FIG. 2 is a top plan view illustrating an enlarged partial region of a light emitting display device according to an embodiment.

FIG. 2 shows a part of the light emitting display panel DP according to an embodiment, and shows a display panel for a mobile phone for convenience of illustration.

The light emitting display panel DP includes the display area DA positioned on the front surface, and the component area EA on the front surface. Additionally, in an embodiment, a plurality of component areas EA are formed, and the position and number of the component areas EA may be variously modified as needed or desired. In FIG. 2, the optical element ES corresponding to the component area EA may be an optical sensor.

The light emitting display panel DP according to an embodiment may be largely divided into a lower panel layer and an upper panel layer. The lower panel layer is a part where the light emitting diode LED and the pixel circuit constituting the pixel PX are positioned, and may include an encapsulation layer (e.g., see 400 of FIG. 18) that covers the lower panel layer. In other words, the lower panel layer may include the layers from a substrate (e.g., see 110 in FIG. 18) to the encapsulation layer, and may also include an anode (Anode), a pixel definition layer (e.g. see 380 in FIG. 18), an emission layer (e.g., EML in FIG. 18), a spacer (e.g., 385 in FIG. 18), a functional layer (e.g., FL in FIG. 18), and a cathode (e.g., Cathode in FIG. 18). An insulating layer, a semiconductor layer, and a conductive layer may be further included in the lower panel layer between the substrate and the anode. The upper panel layer may be a part positioned above the encapsulation layer, and may include a sensing insulating layer (e.g., 501, 510, and 511 in FIG. 18), and a plurality of sensing electrodes (e.g., 540 and 541 of FIG. 18) that may sense the touch. The upper panel layer may include a light blocking member (e.g., 220 of FIG. 18), a color filter (e.g., 230 of FIG. 20), and a planarization layer (e.g., 550 of FIG. 18).

A region other than the component area EA from among the display area DA may also be referred to as 'a normal display area'. In FIG. 2, the structure of the light emitting display panel DP under a cut line is not shown, but the normal display area may be further positioned below the cut line.

The component area EA may include a transparent layer to allow light to pass through, and a non-transparent conductive layer or a semiconductor layer may not be positioned at (e.g., in or on) the component area EA. In the component area EA, a photosensor area OPS through which light may pass is positioned. The photosensor area OPS is positioned on the lower panel layer, and includes an opening (hereinafter, also referred to as an additional opening) formed instead of a pixel definition layer 380, a light blocking member 220, and a color filter layer 230 of the upper panel layer, thereby, having a structure that does not block light. On the other hand, even if the photosensor area OPS is positioned in the lower panel layer, if there is no corresponding opening in the upper panel layer, it may be the display area DA that is not the component area EA. FIG. 19 through FIG. 22, which will be described in more detail below, show one pixel and one photosensor area OPS. When the optical element ES corresponding to the component area EA uses infrared rays instead of visible rays, the component area EA may not block the infrared rays, so that that the component area EA may overlap with the light blocking member 220 that blocks visible rays.

The light emitting display device according to an embodiment may have a polarizer attached to the upper panel layer.

The structure of the lower panel layer of the display area DA is described in more detail below with reference to FIG. 4 through FIG. 22.

A peripheral area may be further positioned outside the display area DA. While FIG. 2 shows a display panel for a mobile phone, the present disclosure is not limited thereto, as long as an optical element is positioned on the rear surface of the display panel, and the display panel may also be part of the flexible display device. In the case of the foldable display device, the position of the component area EA may be formed at different positions from those illustrated in FIG. 2.

Next, a circuit structure of the pixel positioned on the lower panel layer of the light emitting display panel DP is described in more detail with reference to FIG. 3.

Figure 3:
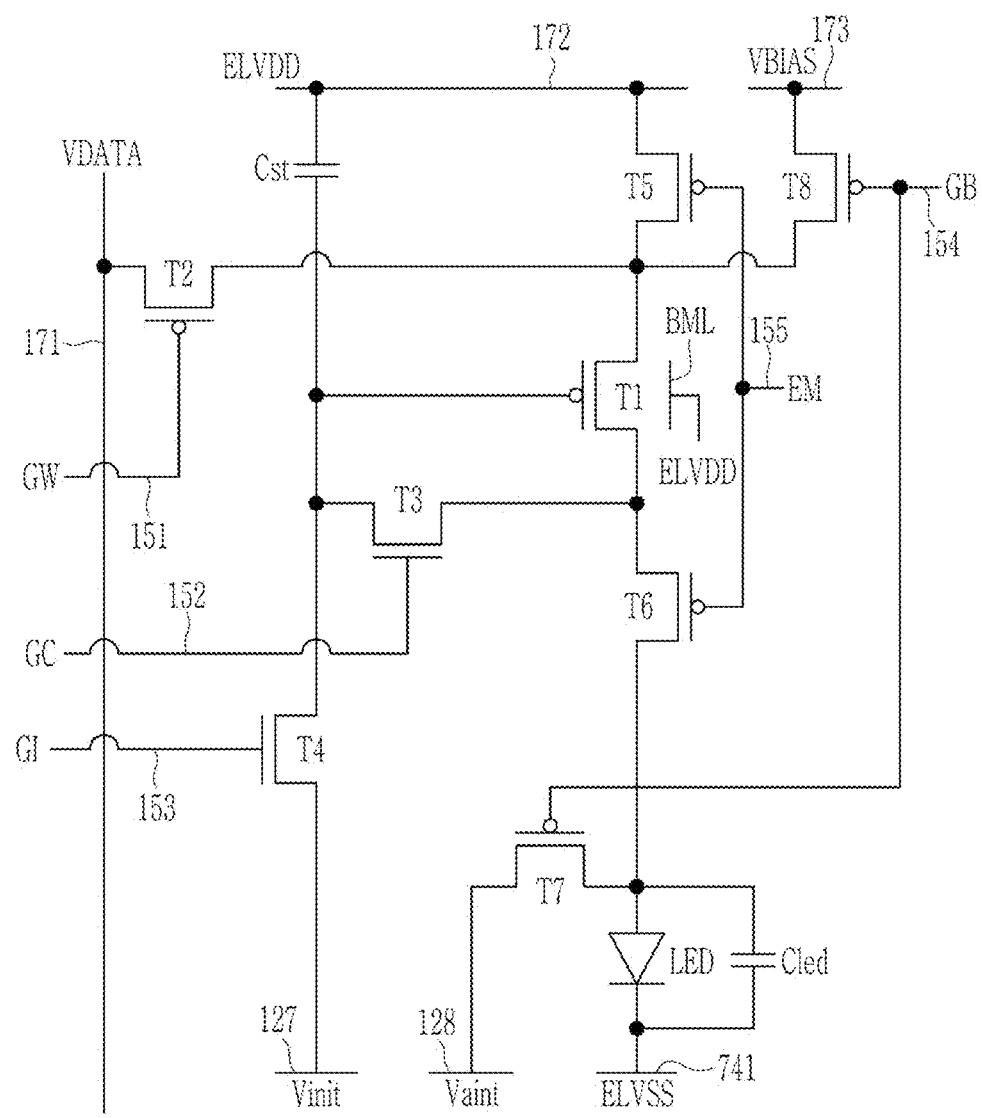
FIG. 3 is a circuit diagram of one pixel included in a light emitting display device according to an embodiment.

FIG. 3 is a circuit diagram of one pixel included in a light emitting display device according to an embodiment.

The pixel structure illustrated in FIG. 3 may be a pixel structure of the component area EA including the display area DA, and/or the photosensor area OPS. Here, the photosensor area OPS is a part that may correspond to the component area EA when at least a part of the light blocking part, such as the pixel definition layer and the light blocking member, is removed. Therefore, if a layer (e.g., the light blocking member when using visible light) that causes a problem in the sensing operation of the optical element ES is included in the upper part of the photosensor area OPS, it may correspond to the display area DA. In addition, the pixel of the component area EA may have a structural difference from that of the pixel positioned in the normal display area, which will be described in more detail below with reference to FIG. 19 through FIG. 22.

FIG. 3 is a circuit diagram of one pixel included in a light emitting display device according to an embodiment.

Referring to FIG. 3, one pixel according to an embodiment includes a plurality of transistors T1, T2, T3, T4, T5, T6, T7, and T8, a storage capacitor Cst, and a light emitting diode LED, which are connected to several wires 127, 128, 151, 152, 153, 154, 155, 171, 172, 173, and 741. Here, the transistors and the capacitors, except for the light emitting diode LED, constitute the pixel circuit part. In the embodiment illustrated in FIG. 3, a diode capacitor Cled having two electrodes corresponding to the anode and the cathode of the light emitting diode LED is also shown, for example, such that the diode capacitor Cled is a capacitor configured by overlapping two electrodes of the light emitting diode LED with each other and/or a capacitor attached to the light emitting diode LED, but the present disclosure is not limited thereto, and the diode capacitor Cled may be omitted as needed or desired.

The plurality of wires 127, 128, 151, 152, 153, 154, 155, 171, 172, 173, and 741 are connected to the one pixel PX. The plurality of wires include a first initialization voltage line 127, a second initialization voltage line 128, a first scan line 151, a second scan line 152, a third scan line 153, a fourth scan line 154, a light emitting control line 155, a data line 171, a driving voltage line 172, a bias voltage line 173, and a common voltage line 741.

According to an embodiment, a wire (hereinafter, also referred to as a BRS wire or an auxiliary data line; e.g., see BRS-1 of FIG. 10 and BRS-2 of FIG. 13) that transmits a data voltage VDATA, like the data line 171, and transmits the data voltage VDATA to an adjacent data line 171 may be further included.

The first scan line 151 is connected to a scan driver to transmit a first scan signal GW to the second transistor T2. A voltage of an opposite polarity to that of the voltage applied to the first scan line 151 may be applied to the second scan line 152 concurrently with (e.g., simultaneously or at the same or substantially the same timing as that of) the signal of the first scan line 151. For example, when a negative voltage is applied to the first scan line 151, a positive voltage may be applied to the second scan line 152. The second scan line 152 transmits a second scan signal GC to the third transistor T3. The third scan line 153 transmits a third scan signal GI to the fourth transistor T4. The fourth scan line 154 transmits a fourth scan signal GB to the seventh transistor T7 and the eighth transistor T8. The light emitting control line 155 transmits a light emitting control signal EM to the fifth transistor T5 and the sixth transistor T6.

The data line 171 is a wire that transmits the data voltage VDATA generated by a data driver. Accordingly, the magnitude of a light emitting current transmitted to the light emitting diode LED may be controlled, and thus, the luminance of the light emitting diode LED may be controlled. The driving voltage line 172 applies a driving voltage ELVDD, and the bias voltage line 173 applies a bias voltage VBIAS. The first initialization voltage line 127 transmits a first initialization voltage Vinit, and the second initialization voltage line 128 transmits a second initialization voltage Vaint. The common voltage line 741 applies a common voltage ELVSS to the cathode of the light emitting diode LED. In the present embodiment, the voltages applied to the driving voltage line 172, the bias voltage line 173, the first and second initialization voltage lines 127 and 128, and the common voltage line 741 may be constant or substantially constant voltages, respectively.

The driving transistor T1 (also referred to as a first transistor) is a p-type transistor, and has a silicon semiconductor as a semiconductor layer. The driving transistor T1 is a transistor that adjusts the magnitude of the light emitting current that is output to the anode of the light emitting diode LED according to the magnitude of the voltage of the gate electrode of the driving transistor T1 (e.g., the voltage stored in the storage capacitor Cst). Because the brightness of the light emitting diode LED is adjusted according to the magnitude of the light emitting current output to the anode of the light emitting diode LED, the light emitting luminance of the light emitting diode LED may be adjusted according to the data voltage VDATA applied to the pixel. The first electrode of the driving transistor T1 is disposed to receive the driving voltage ELVDD, and is connected to the driving voltage line 172 via the fifth transistor T5. In addition, the first electrode of the driving transistor T1 is also connected to the second electrode of the second transistor T2 to receive the data voltage VDATA, and is also connected to the second electrode of the eighth transistor T8 to receive the bias voltage VBIAS. The second electrode of the driving transistor T1 outputs the light emitting current to the light emitting diode LED, and is connected to the anode of the light emitting diode LED via the sixth transistor T6 (hereinafter referred to as an output control transistor). In addition, the second electrode of the driving transistor T1 is also connected to the third transistor T3, and transmits the data voltage VDATA applied to the first electrode of the driving transistor T1 to the third transistor T3. The gate electrode of the driving transistor T1 is connected to one electrode (hereinafter, referred to as a second storage electrode) of the storage capacitor Cst. Accordingly, the voltage of the gate electrode of the driving transistor T1 changes according to the voltage stored in the storage capacitor Cst, and accordingly, the light emitting current output by the driving transistor T1 is controlled.

The storage capacitor Cst serves to keep the voltage of the gate electrode of the driving transistor T1 constant or substantially constant for one frame. The gate electrode of the driving transistor T1 may also be connected to the third transistor T3, so that the data voltage VDATA applied to the first electrode of the driving transistor T1 may be transmitted to the gate electrode of the driving transistor T1 through the third transistor T3. In other words, the third transistor T3 may diode-couple the driving transistor T1. The gate electrode of the driving transistor T1 is also connected to the fourth transistor T4, and may be initialized by receiving the first initialization voltage Vinit. Additionally, the driving transistor T1 may further include a metal layer BML overlapping with the channel thereof, and the metal layer BML may be positioned below (e.g., underneath) the semiconductor layer of the driving transistor T1, to serve to protect the semiconductor layer during a crystallization process. As illustrated in FIG. 3, the driving voltage ELVDD is applied to the metal layer BML, but the present disclosure is not limited thereto, and various suitable voltages may be applied to the metal layer BML as needed or desired.

The second transistor T2 is a p-type transistor, and has a silicon semiconductor as a semiconductor layer. The second transistor T2 is a transistor that receives the data voltage VDATA into the pixel. The gate electrode of the second transistor T2 is connected to the first scan line 151. The first electrode of the second transistor T2 is connected to the data line 171. The second electrode of the second transistor T2 is connected to the first electrode of the driving transistor T1. When the second transistor T2 is turned on by a negative voltage from among the first scan signals GW transmitted through the first scan line 151, the data voltage VDATA transferred through the data line 171 is transferred to the first electrode of the driving transistor T1, and thus, the data voltage VDATA is transferred to the gate electrode of the driving transistor T1 and stored in the storage capacitor Cst.

The third transistor T3 is an n-type transistor, and has an oxide semiconductor as a semiconductor layer. The third transistor T3 electrically connects the second electrode of the driving transistor T1 and the gate electrode of the driving transistor T1 to each other. As a result, the third transistor T3 is a transistor that allows the data voltage DATA to be compensated for by the threshold voltage of the driving transistor T1, and then stored in the second storage electrode of the storage capacitor Cst. The gate electrode of the third transistor T3 is connected to the second scan line 152, and the first electrode of the third transistor T3 is connected to the second electrode of the driving transistor T1. The second electrode of the third transistor T3 is connected to the second storage electrode of the storage capacitor Cst, and the gate electrode of the driving transistor T1. The third transistor T3 is turned on by a positive voltage from among the second scan signals GC received through the second scan line 152, thereby, the gate electrode of the driving transistor T1 and the second electrode of the driving transistor T1 are connected to each other, and the voltage applied to the gate electrode of the driving transistor T1 is transferred to the second storage electrode of the storage capacitor Cst and stored in the storage capacitor Cst. At this time, the voltage stored in the storage capacitor Cst is stored in a state in which the voltage of the gate electrode of the driving transistor T1, when the driving transistor T1 is turned off, is stored, so that the threshold voltage Vth of the driving transistor T1 is compensated for.

The fourth transistor T4 is an n-type transistor, and has an oxide semiconductor as a semiconductor layer. The fourth transistor T4 serves to initialize the gate electrode of the driving transistor T1 and the second storage electrode of the storage capacitor Cst. The gate electrode of the fourth transistor T4 is connected to the initialization control line 153, and the first electrode of the fourth transistor T4 is connected to the first initialization voltage line 127. The second electrode of the fourth transistor T4 is connected to the second electrode of the third transistor T3, the second storage electrode of the storage capacitor Cst, and the gate electrode of the driving transistor T1. The fourth transistor T4 is turned on by a positive voltage of the initialization control signal GI received through the initialization control line 153, and in this case, the first initialization voltage Vinit is transmitted to the gate electrode of the driving transistor T1 and the second storage electrode of the storage capacitor Cst to be initialized.

The fifth transistor T5 and the sixth transistor T6 are p-type transistors, and have a silicon semiconductor as a semiconductor layer.

The fifth transistor T5 serves to transfer a driving voltage (e.g., ELVDD) to the driving transistor T1. The gate electrode of the fifth transistor T5 is connected to the light emitting control line 155, the first electrode of the fifth transistor T5 is connected to the driving voltage line 172, and the second electrode of the fifth transistor T5 is connected to the first electrode of the driving transistor T1.

The sixth transistor T6 serves to transmit the light emitting current output from the driving transistor T1 to the light emitting diode LED. The gate electrode of the sixth transistor T6 is connected to the light emitting control line 155, the first electrode of the sixth transistor T6 is connected to the second electrode of the driving transistor T1, and the second electrode of the sixth transistor T6 is connected to the anode of the light emitting diode LED.

The seventh transistor T7 as a p-type transistor or an n-type transistor may include a silicon semiconductor or an oxide semiconductor as the semiconductor layer. In the embodiment illustrated in FIG. 3, the seventh transistor T7 is shown as a p-type transistor, and includes a silicon semiconductor. The seventh transistor T7 serves to initialize the anode of the light emitting diode LED. The gate electrode of the seventh transistor T7 is connected to the bypass control line 154, the first electrode of the seventh transistor T7 is connected to the anode of the light emitting diode LED, and the second electrode of the seventh transistor T7 is connected to the second initialization voltage line 128. Here, the gate electrode of the seventh transistor T7 may be connected to the first scan line 151 of a previous pixel. When the seventh transistor T7 is turned on by a negative voltage from among the fourth scan line 154, the second initialization voltage Vaint is applied to the anode of the light emitting diode LED to be initialized.

The eighth transistor T8 is a p-type transistor, and includes a silicon semiconductor. The eighth transistor T8 serves to transmit the bias voltage VBIAS to the first electrode of the driving transistor T1. The gate electrode of the eighth transistor T8 is connected to the fourth scan line 154, the first electrode of the eighth transistor T8 is connected to the bias voltage line 173, and the second electrode of the eighth transistor T8 is connected to the first electrode of the driving transistor T1. When the eighth transistor T8 is turned on by the negative voltage of the fourth scan line 154, the bias voltage VBIAS is applied to the first electrode of the driving transistor T1, so that characteristics of the driving transistor T1 may be constantly maintained or substantially maintained.

While the one pixel PX is illustrated as including eight transistors T1 to T8 and one capacitor (the storage capacitor Cst), it is not limited thereto. In addition, although the third transistor T3 and the fourth transistor T4 are shown as n-type transistors in the embodiment illustrated in FIG. 3, the present disclosure is not limited thereto, and only one of the third transistor T3 and the fourth transistor T4 may be formed as an n-type transistor, or one or more of the other transistors (e.g., the seventh transistor T7, and/or the like) may be formed as an n-type transistor.

According to an embodiment, the third transistor and the fourth transistor may be formed of a p-type transistor.

Figure 8:
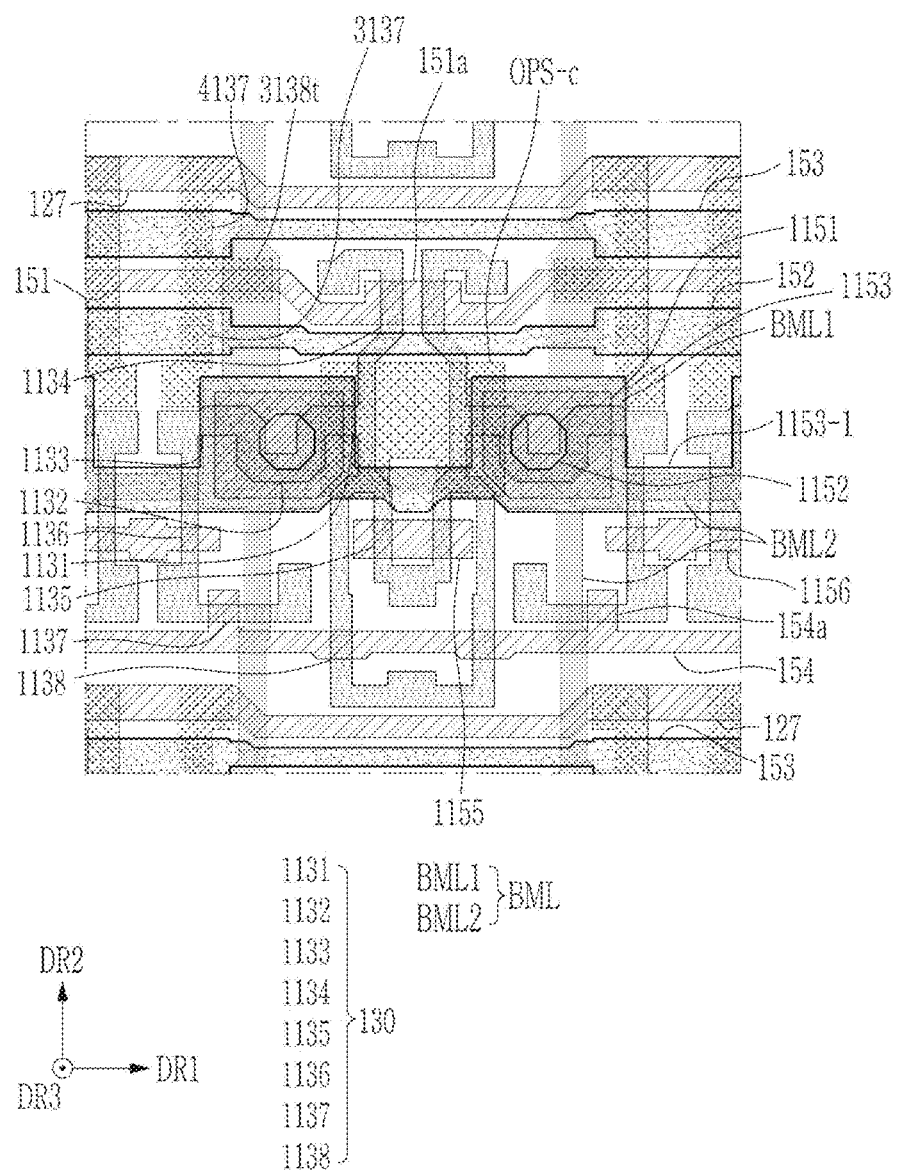

According to an embodiment, a boost capacitor may be further included, and one terminal of the boost capacitor may be connected to the first scan line 151, while the other terminal of the boost capacitor may be connected to the second electrode of the third transistor T3 and/or the second electrode of the fourth transistor T4 (e.g., an extension of 3138t illustrated in FIG. 8).

Hereinafter, a detailed planar structure and a stacking structure of the pixel PX formed at (e.g., in or on) display area DA will be described in more detail with reference to FIG. 4 through FIG. 22.

FIG. 4 through FIG. 17 are views illustrating a structure of each layer according to a manufacturing order of a lower panel layer of a light emitting display device according to an embodiment. FIG. 18 through FIG. 21 are views illustrating a structure of a layer in which a pixel positioned in a component area EA of a light emitting display device according to an embodiment is different from a pixel in a normal display area. FIG. 22 is a cross-sectional view of a light emitting display device according to an embodiment.

FIG. 4 through FIG. 17 show the planar structure of a pixel (hereinafter, referred to as a normal pixel or a first pixel) positioned at (e.g., in or on) the normal display area, and FIG. 18 through FIG. 21 show a part where a pixel (hereinafter, referred to as a component pixel or a second pixel) positioned at (e.g., in or on) the component area EA is different from that of the normal pixel. Referring to FIG. 18 through FIG. 21, the component pixel includes the photosensor area OPS, which is a region where the optical element ES, such as a sensor positioned on the rear surface, may emit and/or receive light. FIG. 22 shows a cross-sectional structure.

First, the stacked structure of the normal pixel will be described in more detail with reference to FIG. 4 through FIG. 17.

FIG. 4 through FIG. 17 are views illustrating a structure of each layer according to a manufacturing sequence of a lower panel layer of a light emitting display device according to an embodiment.

Figure 4:
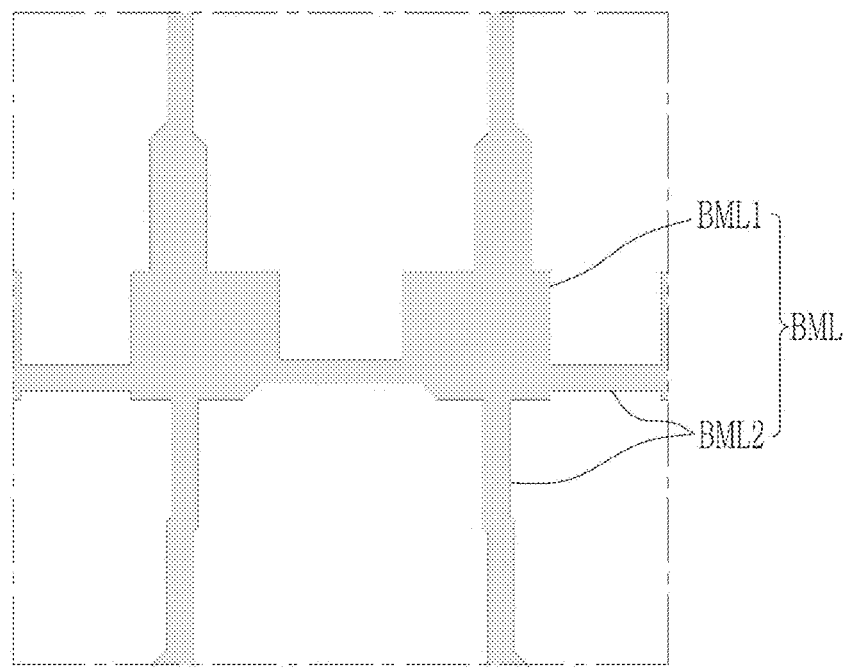
FIG. 4-FIG. 17 are views illustrating a structure of each layer according to a manufacturing order of a lower panel layer of a light emitting display device according to an embodiment.
Figure 4:
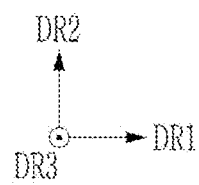

Referring to FIG. 4, a metal layer BML is positioned on a substrate (e.g., 110 of FIG. 22).

The substrate 110 may include a material that does not bend due to a rigid characteristic, such as glass, or a flexible material that may be bent, such as plastic or polyimide. In the case of the flexible substrate, as shown in FIG. 22, the substrate 110 may have a structure including a double-layered structure of polyimide, and a barrier layer formed of an inorganic insulating material on the double-layered structure of polyimide.

The metal layer BML includes a plurality of expansion parts BML1, and a connection part BML2 connecting the plurality of expansion parts BML1 to each other. The expansion part BML1 of the metal layer BML may be formed at the position overlapping with the channel 1132 of the driving transistor T1 on a plane (e.g., in a plan view) from among the first semiconductor layer 130 that is subsequently formed. The metal layer BML is also referred to as a lower shielding layer. The metal layer BML may include a metal or a metal alloy, such as copper (Cu), molybdenum (Mo), aluminum (Al), titanium (Ti), and/or the like, and may additionally include amorphous silicon. The metal layer BML may be a single layer or multiple layers.

Referring to FIG. 22, a buffer layer 111 covering the substrate 110 and the metal layer BML is disposed on the substrate 110 and the metal layer BML. The buffer layer 111 serves to block penetration of impurity elements into the first semiconductor layer 130, and may be an inorganic insulating layer including a silicon oxide (SiOx), a silicon nitride (SiNx), a silicon oxynitride (SiOxNy), or the like.

Figure 5:
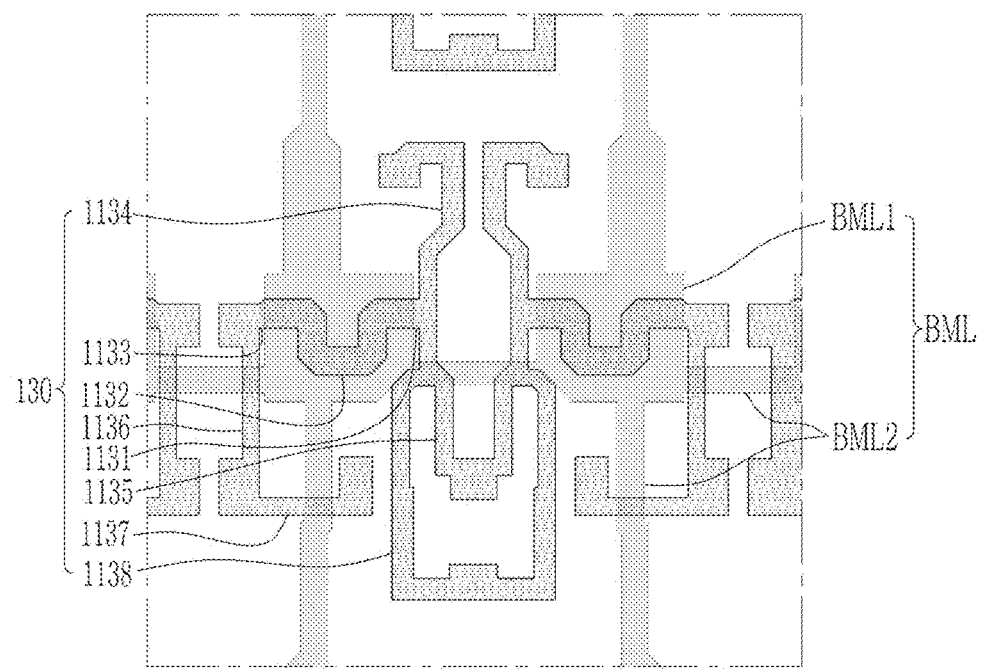

As shown in FIG. 5, the first semiconductor layer 130 formed of a silicon semiconductor (e.g., a polycrystalline semiconductor) is positioned on the buffer layer 111. The first semiconductor layer 130 includes a channel 1132, a first area 1131, and a second area 1133 of the driving transistor T1. In addition, the first semiconductor layer 130 includes the channels of the second transistor T2, the fifth transistor T5, the sixth transistor T6, the seventh transistor T7, and the eighth transistor T8, as well as that of the driving transistor T1, and has areas having a conductive layer characteristic by plasma processing or doping on opposite sides of each channel to serve as the first and second electrodes of the corresponding transistors.

The channel 1132 of the driving transistor T1 may have a curved shape of a "U" type on a plane (e.g., in a plan view). However, the shape of channel 1132 of the driving transistor T1 is not limited thereto, and may be variously modified as needed or desired. For example, the channel 1132 of the driving transistor T1 may be bent into various different suitable shapes, such as an "S" shape, or may have a bar shape.

The first area 1131 and the second area 1133 of the driving transistor T1 may be positioned on opposite sides of the channel 1132 of the driving transistor T1. The first area 1131 and the second area 1133 positioned in the first semiconductor layer 130 serve as the first electrode and the second electrode of the driving transistor T1.

A channel, a first area, and a second area of the second transistor T2 are positioned in the portion 1134 extending upward (e.g., in the second direction DR2) from the first area 1131 of the driving transistor T1 in the first semiconductor layer 130. The part extending downward from the first region 1131 of the driving transistor T1 (e.g., in the opposite direction of the second direction DR2) is divided into two parts 1135 and 1138. The channel, the first region, and the second region of the fifth transistor T5 are positioned in one part 1135, and the channel, the first region, and the second region of the eighth transistor T8 are positioned in the other part 1138. The channel, the first region, and the second region of the sixth transistor T6 are positioned in the portion 1136 extending downward from the second region 1133 of the driving transistor T1. The channel, the first region and the second region of the seventh transistor T7 are positioned in the portion 1137 that is further extended, while being bent from the portion 1136 of the first semiconductor layer 130.

Referring to FIG. 22, a first gate insulating layer 141 may be positioned on the first semiconductor layer 130 including the channel 1132, the first region 1131, and the second region 1133 of the driving transistor T1. The first gate insulating layer 141 may be an inorganic insulating layer including a silicon oxide (SiOx), a silicon nitride (SiNx), a silicon oxynitride (SiOxNy), or the like.

Figure 6:
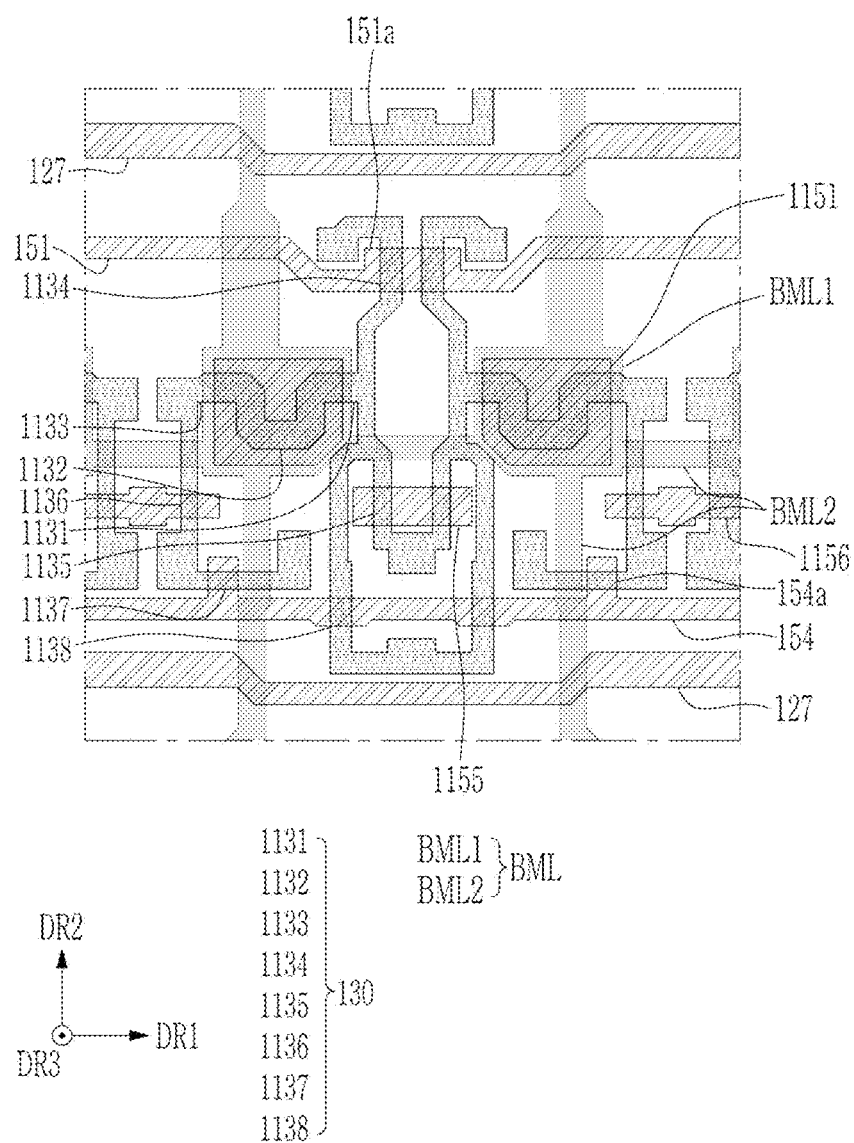

Referring to FIG. 6, a first gate conductive layer including a gate electrode 1151 of the driving transistor T1 may be positioned on the first gate insulating layer 141. The first gate conductive layer includes a gate electrode of each of the second transistor T2, the fifth transistor T5, the sixth transistor T6, the seventh transistor T7, and the eighth transistor T8, as well as that of the driving transistor T1. The gate electrode 1151 (hereinafter, also referred to as a driving gate electrode) of the driving transistor T1 has an island-like structure, and may overlap with the channel 1132 of the driving transistor T1. The channel 1132 of the driving transistor T1 is covered by the gate electrode 1151 of the driving transistor T1. In addition, the first gate conductive layer further includes a gate electrode 1155 of the fifth transistor T5 and a gate electrode 1156 of the sixth transistor T6 having an island-like structure. The channels of the fifth transistor T5 and the sixth transistor T6 are covered by the gate electrode 1155 of the fifth transistor T5 and the gate electrode 1156 of the sixth transistor T6.

The first gate conductive layer may further include a first scan line 151 and a light emission control line 155. The first scan line 151 and the light emission control line 155 may extend in in a horizontal direction or in an approximately horizontal direction (hereinafter also referred to as a first direction). The first scan line 151 may be connected to the gate electrode of the second transistor T2, and the first scan line 151 may be formed integrally with the gate electrode of the second transistor T2. The fourth scan line 154 may be connected to or integrated with the gate electrode of the seventh transistor T7 and the gate electrode of the eighth transistor T8. In the embodiment illustrated in FIG. 6, the protruded part in the fourth scan line 154 may be the gate electrode of the seventh transistor T7.

The first gate conductive layer extends in the first direction DR1, and may also include a first initialization voltage line 127 to which the first initialization voltage Vint is applied.

The first gate conductive layer may include a metal, such as copper (Cu), molybdenum (Mo), aluminum (Al), titanium (Ti), or a suitable metal alloy, and may be configured as a single layer or multiple layers.

After the first gate conductive layer including the gate electrode 1151 of the driving transistor T1 is formed, a plasma treatment or a doping process is performed to make the exposed area of the first semiconductor layer conductive. In other words, the first semiconductor layer that is covered by the first gate conductive layer is not conductive, and a portion of the first semiconductor layer that is not covered by the first gate conductive layer may have the same or substantially the same characteristics as those of a conductive layer. The portion of the first semiconductor layer 130 having the same or substantially the same characteristics as those of the conductive layer may serve as the first electrode and the second electrode of the corresponding transistor. As a result, the transistor including the conductive portion has a p-type transistor characteristic, and the driving transistor T1, the second transistor T2, the fifth transistor T5, the sixth transistor T6, the seventh transistor T7, and the eighth transistor T8 may each be a p-type transistor.

Referring to FIG. 22, a second gate insulating layer 142 may be positioned on the first gate conductive layer including the gate electrode 1151 of the driving transistor T1, and on the first gate insulating layer 141. The second gate insulating layer 142 may be an inorganic insulating layer including a silicon oxide (SiOx), a silicon nitride (SiNx), a silicon oxynitride (SiOxNy), or the like.

Figure 7:
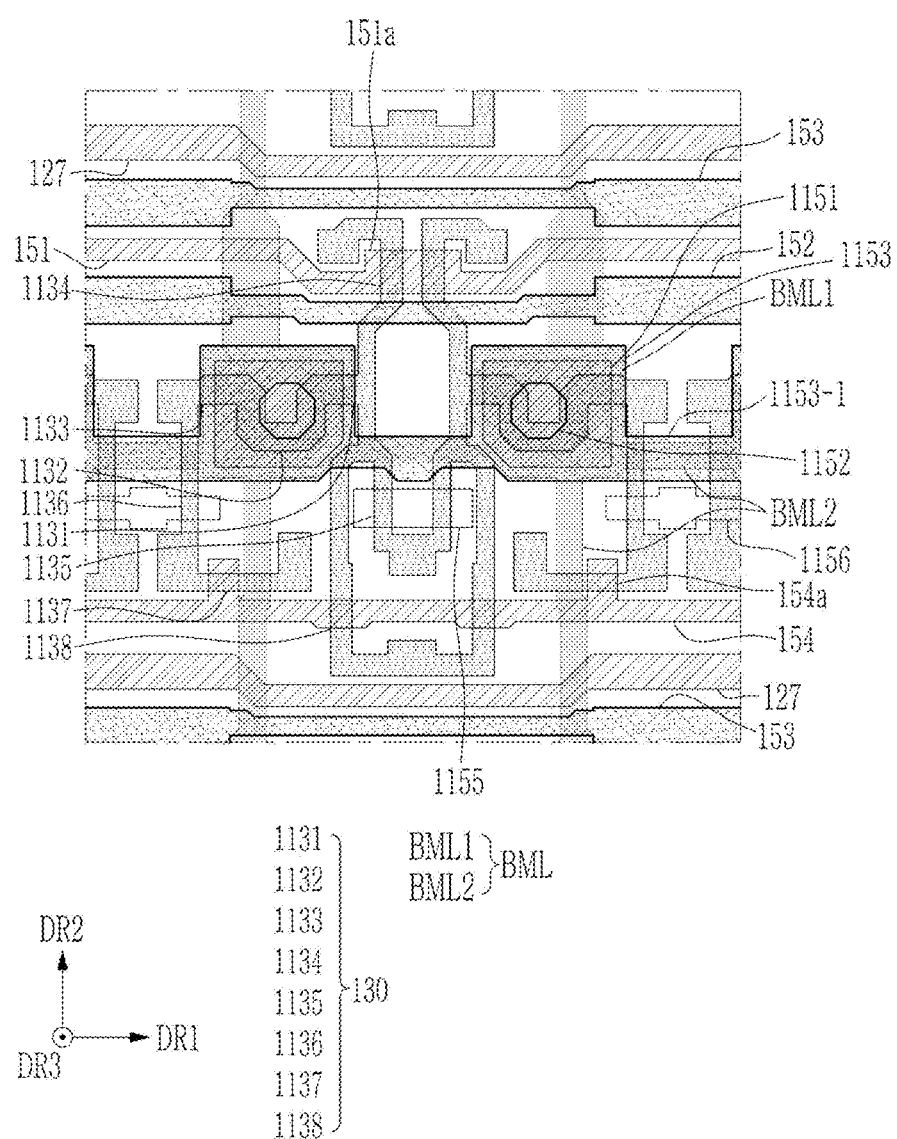

Referring to FIG. 7, a second gate conductive layer GAT2 including a first storage electrode 1153 of the storage capacitor Cst, a second scan line 152, and a third scan line 153 may be positioned on the second gate insulating layer 142.

The first storage electrode 1153 overlaps with the gate electrode 1151 of the driving transistor T1 to form the storage capacitor Cst. An opening 1152 is formed in (e.g., penetrates) the first storage electrode 1153 of the storage capacitor Cst. The opening 1152 of the first storage electrode 1153 of the storage capacitor Cst may overlap with the gate electrode 1151 of the driving transistor T1. The first storage electrode 1153 may include a connection part 1153-1 extending in a horizontal direction (e.g., the first direction DR1) and connecting adjacent first storage electrodes 1153 to each other.

The second scan line 152 and the third scan line 153 may extend or approximately extend in the horizontal direction (e.g., the first direction DR1). The second scan line 152 may be connected to the gate electrode of the third transistor T3, and the second scan line 152 may be formed integrally with the gate electrode of the third transistor T3. The third scan line 153 may be connected to or formed integrally with the gate electrode of the fourth transistor T4. A portion of the second scan line 152 and the third scan line 153 is positioned below the channel of the third transistor T3 and the fourth transistor T4, respectively, and may serve to shield from optical or electromagnetic interference provided to the channels from the lower side.

The second gate conductive layer GAT2 may include a metal or a metal alloy, such as copper (Cu), molybdenum (Mo), aluminum (Al), or titanium (Ti), and may be configured of a single layer or multiple layers.

Referring to FIG. 22 a first interlayer insulating layer 161 may be positioned on the second gate conductive layer GAT2 including the first storage electrode 1153 of the storage capacitor Cst. The first interlayer insulating layer 161 may include an inorganic insulating layer including a silicon oxide (SiOx), a silicon nitride (SiNx), a silicon oxynitride (SiOxNy), and/or the like, and a thickness of the inorganic insulating material may be increased according to an embodiment.

Referring to FIG. 8, an oxide semiconductor layer including a channel 3137 of the third transistor T3, a channel 4137 of the fourth transistor T4, and a shielding layer OPS-c may be positioned on the first interlayer insulating layer 161.

The channel 3137 of the third transistor T3 and the channel 4137 of the fourth transistor T4 may be connected to each other or may be formed integrally with each other. The first region and the second region of the third transistor T3 are positioned on opposite sides of the channel 3137 of the third transistor T3, and the first region and the second region of the fourth transistor T4 are positioned on opposite sides of the channel 4137 of the fourth transistor T4. The second region of the third transistor T3 may be connected to the second region of the fourth transistor T4. The channel 3137 of the third transistor T3 overlaps with the portion (e.g., a lower shielding part) of the second scan line 152, and the channel 4137 of the fourth transistor T4 overlaps the portion (e.g., a lower shielding part) of the third scan line 153.

An expansion part 3138t having an extended width is formed between the second region of the third transistor T3 and the second region of the fourth transistor T4. The expansion part 3138t may overlap with the first scan line 151 to form a boost capacitor Cboost. According to an embodiment, the boost capacitor Cboost may be omitted as needed or desired.

The shielding layer OPS-c has an island-like structure, and may have a conductive characteristic to shield an electromagnetic characteristic, while having a transparent characteristic through which light may pass. Here, the shielding layer OPS-c is doped in a subsequent process of the oxide semiconductor layer, so that it has the same or substantially the same characteristics as those of a conductor, and may have a transparent characteristic. The shielding layer OPS-c may be formed of a transparent conductive material (e.g., a TCO such as ITO, IZO, and/or the like) according to an embodiment. The shielding layer OPS-c overlaps with the photosensor area OPS of the component pixel positioned at (e.g., in or on) the component area EA on a plane (e.g., in a plan view), and may even be positioned in a part corresponding to the photosensor area OPS of the component pixel in the normal pixel positioned at (e.g., in or on) the display area DA and not at (e.g., in or on) the component area EA. However, according to an embodiment, the shielding layer OPS-c may not be formed in the normal pixel.

Referring to FIG. 22, a third gate insulating layer 143 may be positioned on the oxide semiconductor layer including the channel 3137 of the third transistor T3, the channel 4137 of the fourth transistor T4, and the shielding layer OPS-c.

The third gate insulating layer 143 may be positioned on the entire or substantially the entire surface of the oxide semiconductor layer and the first interlayer insulating layer 161. Accordingly, the third gate insulating layer 143 may cover the upper surface and the side surface of the channel 3137 of the third transistor T3, the channel 4137 of the fourth transistor T4, and the shielding layer OPS-c. However, the present disclosure is not limited thereto.

The third gate insulating layer 143 may include an inorganic insulating layer including a silicon oxide (SiOx), a silicon nitride (SiNx), a silicon oxynitride (SiOxNy), or the like.

Figure 9:
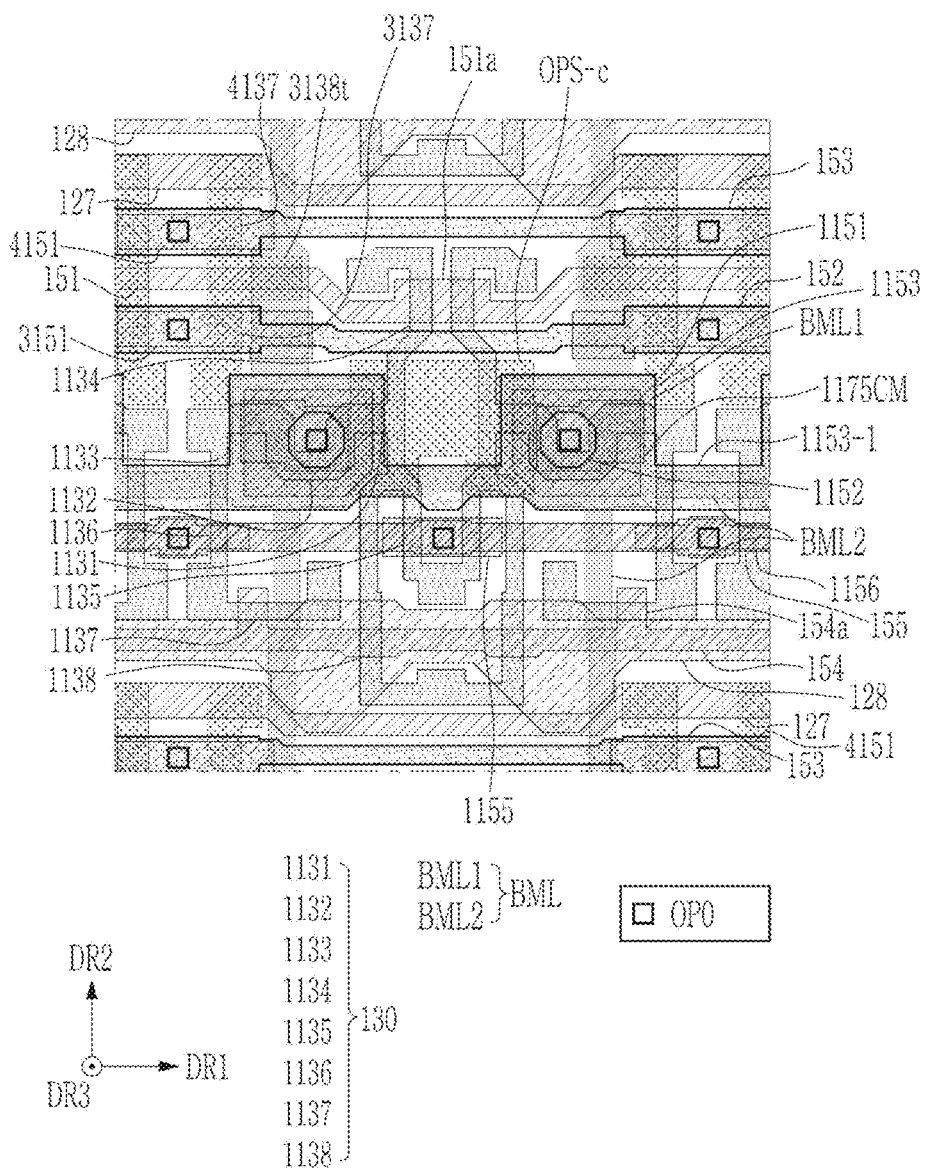

Referring to FIG. 9, the third gate insulating layer 143 includes an opening OP0. A third gate conductive layer including a gate electrode 3151 of the third transistor T3 and a gate electrode 4151 of the fourth transistor T4 may be positioned on the third gate insulating layer 143 formed with the opening OP0.

The opening OP0 may be formed in (e.g., may penetrate) the first interlayer insulating layer 161 and the third gate insulating layer 143, to expose the second scan line 152 and the third scan line 153 of the second gate conductive layer. Also, the opening OP0 may be formed in (e.g., may penetrate) the second gate insulating layer 142, the first interlayer insulating layer 161, and the third gate insulating layer 143 to expose the driving gate electrode 1151 of the driving transistor T1, the gate electrode 1155 of the fifth transistor T5, and the gate electrode 1156 of the sixth transistor T6 from among the first gate conductive layer.

The third gate conductive layer includes the gate electrode 3151 of the third transistor T3 and the gate electrode 4151 of the fourth transistor T4.

The gate electrode 3151 of the third transistor T3 has an island structure, and may overlap with the channel 3137 of the third transistor T3. The gate electrode 3151 of the third transistor T3 is electrically connected to the second scan line 152 through the opening OP0.

The gate electrode 4151 of the fourth transistor T4 has an island-like structure, and may overlap with the channel 4137 of the fourth transistor T4. The gate electrode 4151 of the fourth transistor T4 is electrically connected to the third scan line 153 through the opening OP0.

The third gate conductive layer may further include a second initialization voltage line 128 and a light emitting control line 155.

The second initialization voltage line 128 may extend or approximately extend in a horizontal direction (e.g., the first direction), and the second initialization voltage Vaint is applied thereto.

The light emitting control line 155 extends or approximately extends in the horizontal direction (e.g., the first direction DR1), and is electrically connected to the gate electrode 1155 of the fifth transistor T5 and the gate electrode 1156 of the sixth transistor T6 through the opening OP0. As a result, the light emitting control signal EM applied through the light emitting control line 155 is transmitted to the gate electrode 1155 of the fifth transistor T5 and the gate electrode 1156 of the sixth transistor T6.

In addition, the third gate conductive layer may further include a connection electrode 1175CM for the driving gate electrode.

The connection electrode 1175CM for the driving gate electrode has an island-like structure, and is connected to the driving gate electrode 1151 through the opening OP0. In this case, the connection electrode 1175CM for the driving gate electrode and the driving gate electrode 1151 are connected to each other through the opening 1152 formed in (e.g., penetrating) the first storage electrode 1153 of the storage capacitor Cst.

The third gate conductive layer GAT3 may include a metal or a metal alloy, such as copper (Cu), molybdenum (Mo), aluminum (Al), or titanium (Ti), and may be composed of a single layer or multiple layers.

After forming the third gate conductive layer including the gate electrode 3151 of the third transistor T3, and the gate electrode 4151 of the fourth transistor T4, the portion of the oxide semiconductor layer covered by the third gate conductive layer is formed into the channel through plasma treatment or a doping process. The portion of the oxide semiconductor layer not covered by the third gate conductive layer becomes conductive. The channel 3137 of the third transistor T3 may be positioned under the gate electrode 3151 to overlap with the gate electrode 3151. The first area 3136 and the second area 3138 of the third transistor T3 may not overlap with the gate electrode 3151. The channel 4137 of the fourth transistor T4 may be positioned under the gate electrode 4151 to overlap with the gate electrode 4151. The first area 4136 and the second area 4138 of the fourth transistor T4 may not overlap with the gate electrode 4151. The expansion part 3138*t* may not overlap with the third gate conductive layer. Also, the shielding layer OPS-c may not overlap with the third gate conductive layer, so that the shielding layer OPS-c may have the same/similar characteristic as that of a conductor's conductivity.

A transistor including an oxide semiconductor layer may have characteristics of an n-type transistor.

Referring to FIG. 22, a second interlayer insulating layer 162 may be positioned on the third gate conductive layer including the gate electrode 3151 of the third transistor T3 and the gate electrode 4151 of the fourth transistor T4. The second interlayer insulating layer 162 may have a single-layer or multi-layered structure. The second interlayer insulating layer 162 may include an inorganic insulating material, such as a silicon nitride (SiNx), a silicon oxide (SiOx), or a silicon oxynitride (SiOxNy), and may include an organic material according to an embodiment.

Figure 10:
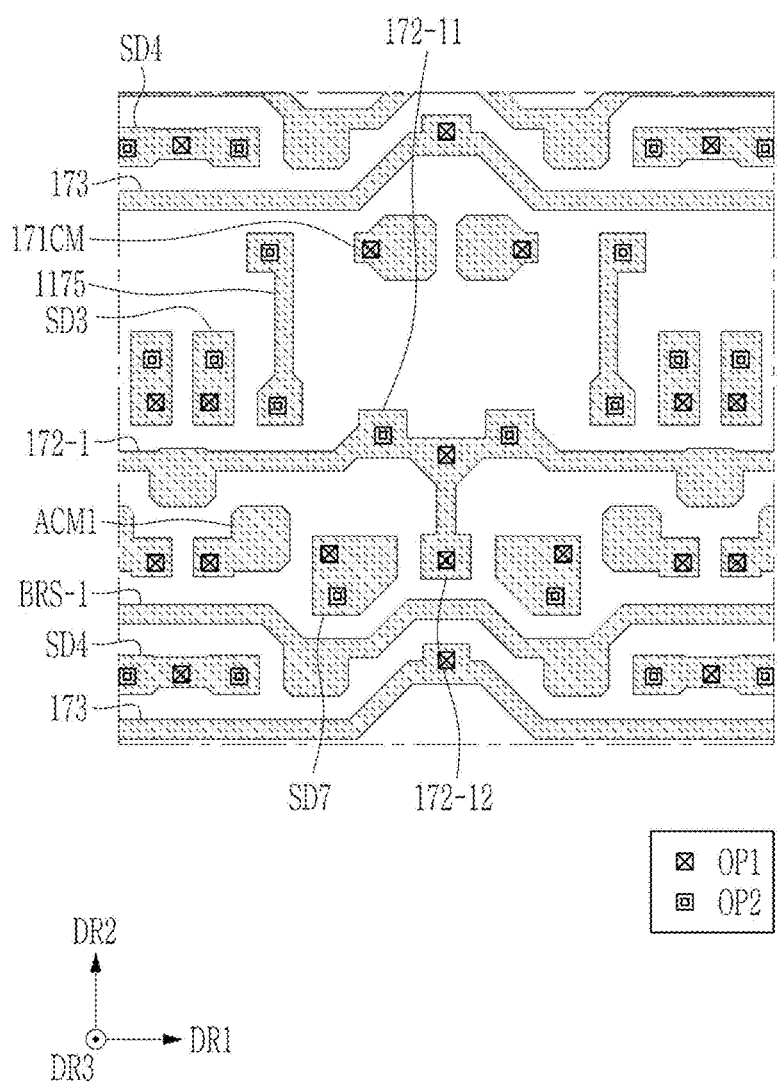
Figure 11:
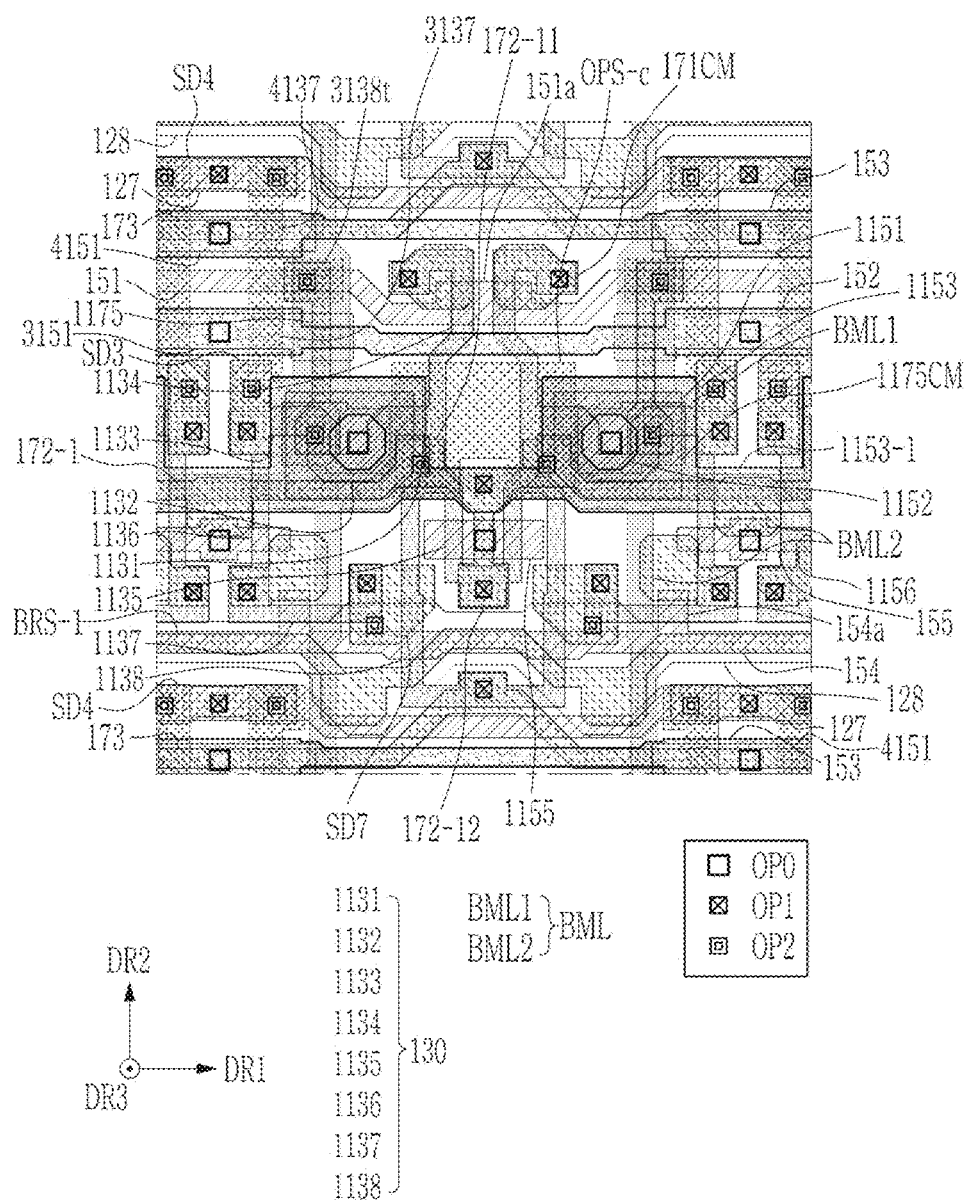

Referring to FIG. 10 and FIG. 11, openings OP1 and OP2 may be formed in (e.g., may penetrate) the second interlayer insulating layer 162, and a first data conductive layer may be positioned on the second interlayer insulating layer 162. FIG. is a top plan view showing only the first data conductive layer and the openings OP1 and OP2 for convenience and ease of comprehension, and FIG. 11 is a top plan view showing various layers under the first data conductive layer.

Referring to FIG. 10, two kinds of openings OP1 and OP2 may be formed in (e.g., may penetrate) the second interlayer insulating layer 162. The two kinds of openings OP1 and OP2 may be formed using different masks.

The opening OP1 may be formed in (e.g., may penetrate) at least one of the interlayer insulating layer 162, the third gate insulating layer 143, the first interlayer insulating layer 161, the second gate insulating layer 142, or the first gate insulating layer 141, and may expose the first semiconductor layer 130, the first gate conductive layer, or the second gate conductive layer.

The opening OP2 may be formed in (e.g., may penetrate) the second interlayer insulating layer 162 and/or the third gate insulating layer 143, and may expose the oxide semiconductor layer or the third gate conductive layer.

Referring to FIG. 10 and FIG. 11, the first data conductive layer may include a first driving voltage line 172-1, a bias voltage line 173, a first auxiliary data line BRS-1 (hereafter, also referred to as an additional auxiliary data line), and various connection electrodes 1175, SD3, SD4, SD7, 171CM, and ACM1.

The first driving voltage line 172-1 and the bias voltage line 173 extend or approximately extend in the horizontal direction (e.g., the first direction DR1), and transmit the driving voltage ELVDD and the bias voltage VBIAS, respectively.

The first driving voltage line 172-1 is connected to the connection part 1153-1 of the first storage electrode 1153 positioned on the second gate conductive layer through the opening OP1. In addition, the first driving voltage line 172-1 includes an expansion part 172-11, which is widely extended, and an expansion part 172-12, which is extended in the vertical direction (e.g., the second direction DR2). The expansion part 172-11 of the first driving voltage line 172-1 is connected to the shielding layer OPS-c positioned on the oxide semiconductor layer through the opening OP2. The expansion part 172-12 of the first driving voltage line 172-1 is connected to a part 1135 positioned on the first semiconductor layer through the opening OP1. As a result, the driving voltage ELVDD is transferred to the first storage electrode 1153, the shielding layer OPS-c, and one terminal of the fifth transistor T5.

The bias voltage line 173 is connected to a part 1138 positioned on the first semiconductor layer through the opening OP1. As a result, the bias voltage VBIAS is transmitted to one terminal of the eighth transistor T8.

The first auxiliary data line BRS-1 extends or approximately extends in the horizontal direction (e.g., the first direction DR1), and has a partially extended part. The first auxiliary data line BRS-1 transmits the data voltage VDATA like the data line 171, and is electrically connected to the other auxiliary data line (e.g., BRS-2 in FIG. 13) and the adjacent data line 171 through the part of which the width is extended. Thus, the data voltage VDATA is transferred to the corresponding data line 171. The auxiliary data lines BRS-1 and BRS-2 may reduce the width in half of a fan-out part, or in other words, a part where the data line 171 and the driving part 50 are connected to each other, and as a result, the area of the fan-out part is also reduced by half. Accordingly, the non-display area may be reduced. FIG. 10 through FIG. 21 show the auxiliary data lines BRS-1 and BRS-2 without an opening, but the auxiliary data lines BRS-1 and BRS-2 may be electrically connected by forming an opening in a part where a connection is needed or desired.

Various connection electrodes 1175, SD3, SD4, SD7, 171CM, and ACM1 included in the first data conductive layer are described in more detail as follows.

The connection electrode 1175 is to connect the gate electrode 1151 of the driving transistor T1 and the third transistor T3 to each other, and is connected to the expansion part 3138*t* of the oxide semiconductor layer and the connection electrode 1175CM for the driving gate electrode of the third gate conductive layer through the opening OP2. The connection electrode 1175CM for the driving gate electrode is connected to the driving gate electrode 1151, thereby having a structure that is also connected to the gate electrode 1151 of the driving transistor T1, the second region of the third transistor T3, and the second region of the fourth transistor T4.

The connection electrode SD3 is connected to the second region 1133 of the driving transistor T1 of the first semiconductor layer 130 through the opening OP1, and is connected to the first region of the third transistor T3 through the opening OP2. As a result, the second region 1133 of the driving transistor T1 and the first region of the third transistor T3 are connected to each other by the connection electrode SD3.

The connection electrode SD4 is connected to the first initialization voltage line 127 of the first gate conductive layer through the opening OP1, and is connected to the first region of the fourth transistor T4 of the oxide semiconductor layer through the opening OP2. As a result, the first initialization voltage Vint may be transmitted to the first region of the fourth transistor T4 through the connection electrode SD4.

The connection electrode SD7 is connected to a part 1137 of the first semiconductor layer 130 through the opening OP1, and is connected to the second initialization voltage line 128 through the opening OP2. As a result, the second initialization voltage Vaint may be transmitted to the first region of the seventh transistor T7 through the connection electrode SD7.

The data line connection electrode 171CM is connected to a part 1134 of the first semiconductor layer 130 through the opening OP1 to be electrically connected to the first region of the second transistor T2.

The first anode connection electrode ACM1 is electrically connected to a part 1136 of the first semiconductor layer 130 (e.g., such as the second region of the sixth transistor T6) through the opening OP1.

The first data conductive layer SD1 may include a metal or a metal alloy, such as copper (Cu), molybdenum (Mo), aluminum (Al), or titanium (Ti), and may be configured of a single layer or multiple layers.

Referring to FIG. 22, a first organic layer 181 may be positioned on the first data conductive layer. The first organic layer 181 may be an organic insulator including an organic material. The organic material may include at least one material selected from the group consisting of polyimide, polyamide, acryl resin, benzocyclobutene, and phenol resin.

Figure 12:
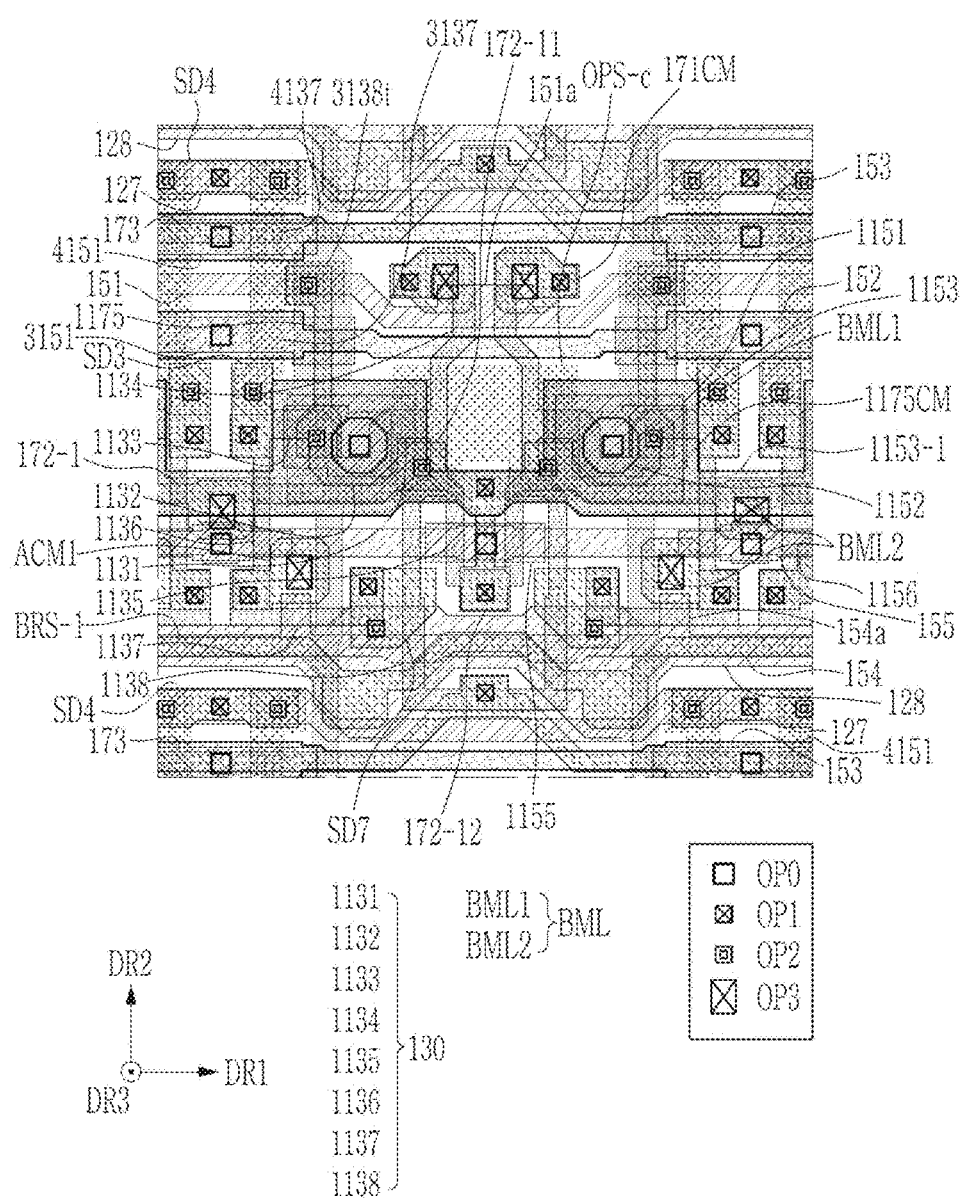

Referring to FIG. 12, the first organic layer 181 includes a lower organic layer opening OP3. The lower organic layer opening OP3 exposes the part of the first driving voltage line 172-1 of the first data conductive layer, the data line connection electrode 171CM, and the first anode connection electrode ACM1.

Figure 13:
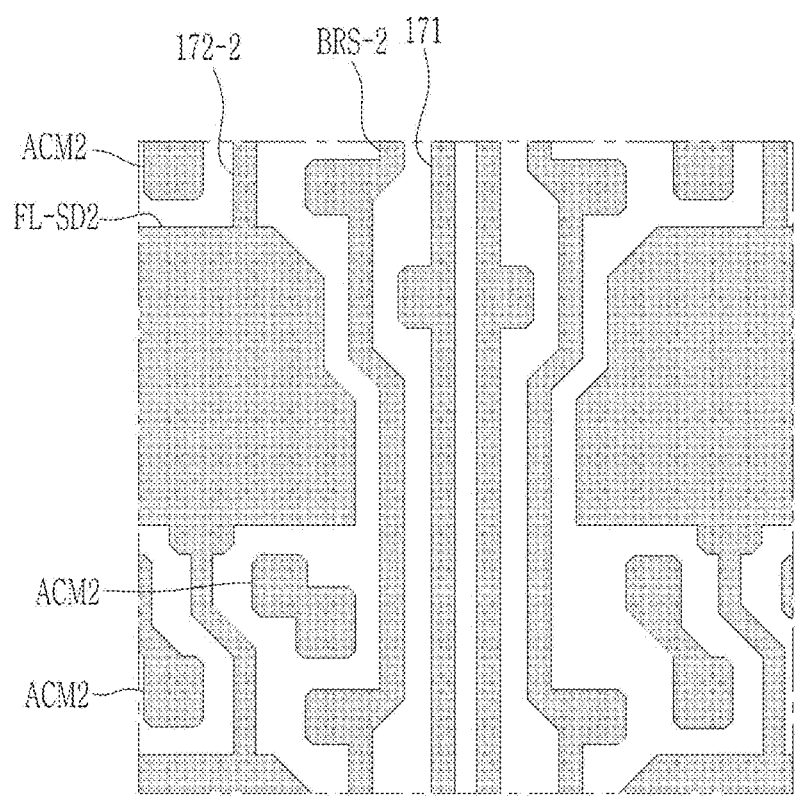
Figure 14:
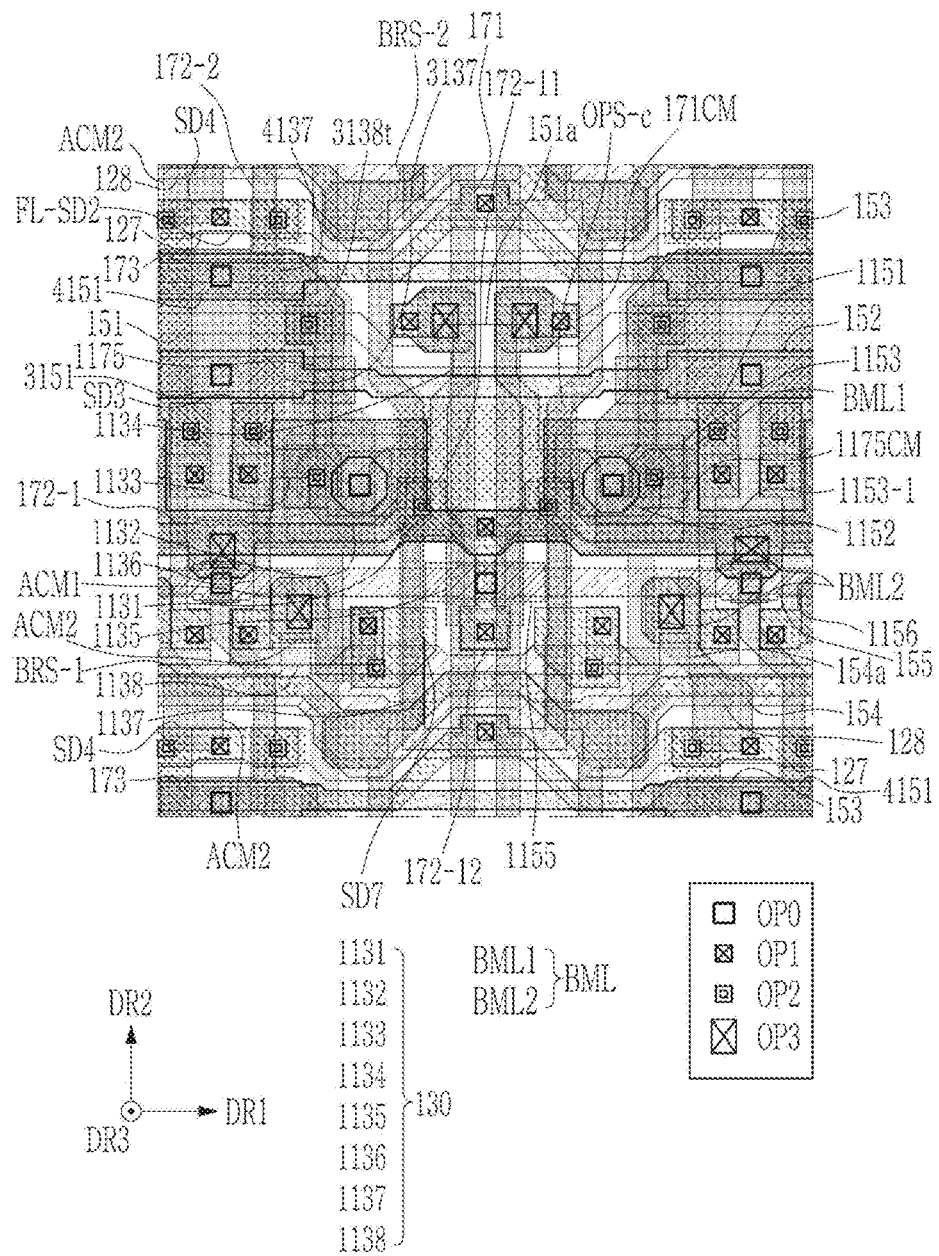

Referring to FIG. 13 and FIG. 14, a second data conductive layer including a data line 171, a second driving voltage line 172-2, the second auxiliary data line BRS-2 (hereinafter, referred to as a main auxiliary data line), and a second anode connection electrode ACM2 may be positioned on the first organic layer 181.

FIG. 13 is a top plan view showing only the second data conductive layer for convenience and ease of comprehension, and FIG. 14 is a top plan view showing the second data conductive layer and various surrounding layers.

The data line 171 extends in or approximately in the vertical direction (e.g., the second direction DR2), and is connected to the data line connection electrode 171CM through the lower organic layer opening OP3 to be connected to the second transistor T2.

The second driving voltage line 172-2 extends in or approximately in the vertical direction (e.g., the second direction DR2), and is electrically connected to a part of the first driving voltage line 172-1 of the first data conductive layer through the lower organic layer opening OP3. The driving voltage ELVDD is transmitted in both the first direction DR1 and the second direction DR2 through the first driving voltage line 172-1 and the second driving voltage line 172-2, thereby eliminating or reducing a variation in voltage values depending on positions due to a voltage drop.

Referring to FIG. 13, the second driving voltage line 172-2 further includes an expansion part FL-SD2. The expansion part FL-SD2 is formed wider to flatten or substantially flatten the anode positioned thereon. As a result, if the anode has a flattened or substantially flattened characteristic, external light may be prevented or substantially prevented from being reflected asymmetrically from the anode (Anode), thereby reducing a reflected color band due to color spread (e.g., color separation) caused by the reflected light, and improving the display quality.

The second anode connection electrode ACM2 is electrically connected to the first anode connection electrode ACM1 of the first data conductive layer through the opening OP3, and is electrically connected to the second region of the sixth transistor T6.

The second auxiliary data line BRS-2 extends in or approximately in the vertical direction (e.g., the second direction DR2), and extends in a direction parallel to or substantially parallel to the data line 171. The second auxiliary data line BRS-2 is connected to the first auxiliary data line BRS-1 positioned in the first data conductive layer, thereby, serving to transfer the data voltage VDATA to the adjacent data line 171. The first auxiliary data line BRS-1 has an extension direction crossing the extension direction of the data line 171 and the second auxiliary data line BRS-2, so that the data voltage applied through the second auxiliary data line BRS-2 may be applied to the adjacent data line 171. The width and the area of the fan-out portion may be reduced by the auxiliary data lines BRS-1 and BRS-2, and accordingly, the non-display area may also be reduced. Two auxiliary data lines BRS-1 and BRS-2 may be connected to each other through the opening positioned at (e.g., in or on) the first organic layer 181, and connected to the data line 171 that needs or uses the connection, so that the data voltage VDATA may be transmitted thereto.

The second data conductive layer may include a metal or a metal alloy, such as aluminum (Al), copper (Cu), molybdenum (Mo), or titanium (Ti), and may be configured of a single layer or multiple layers.

Figure 20:
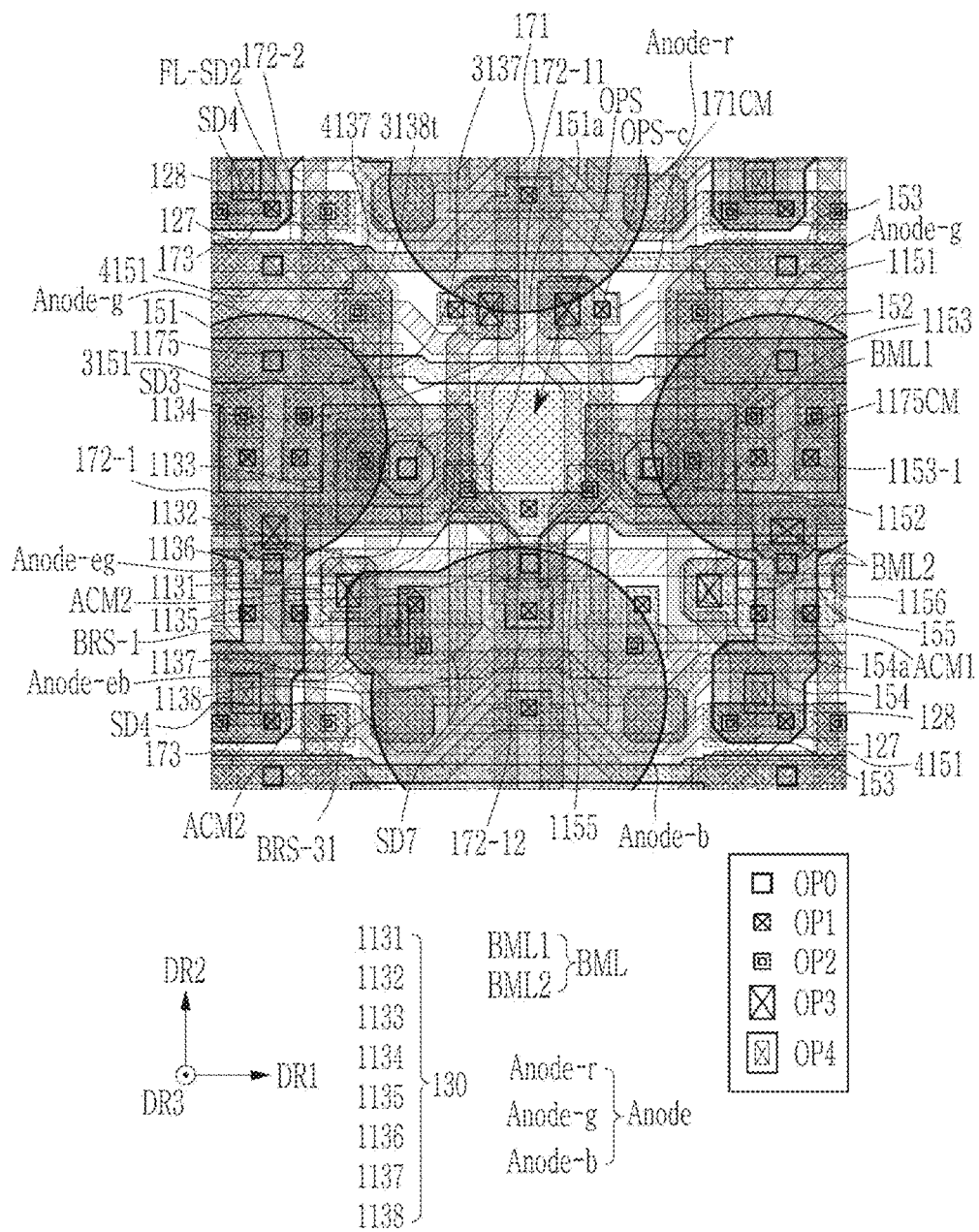

Referring to FIG. 20, the second organic layer 182 and the third organic layer 183 are positioned on the second data conductive layer. The second organic layer 182 and the third organic layer 183 may be organic insulators, and may include at least one material selected from the group consisting of polyimide, polyamide, acryl resin, benzocyclobutene, and phenol resin. According to an embodiment, the third organic layer 183 may be omitted.

Figure 15:
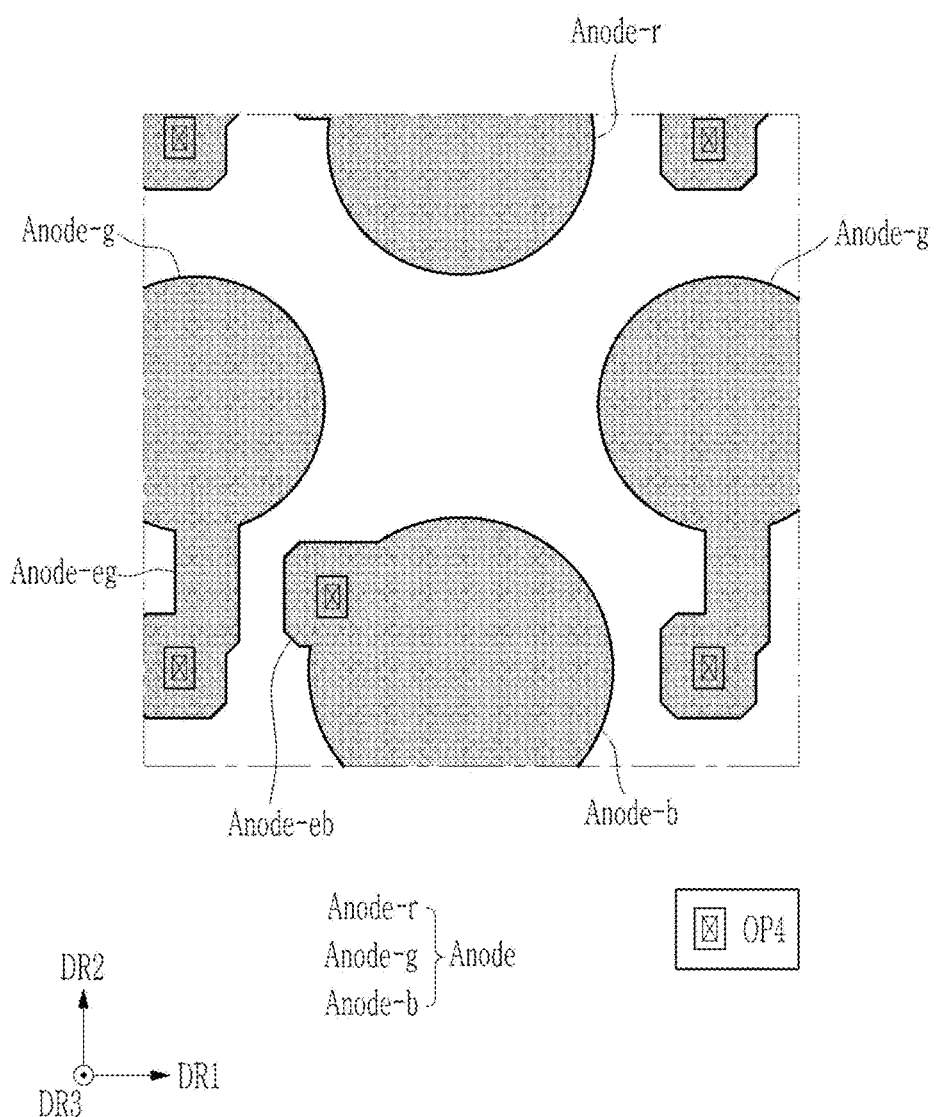
Figure 16:
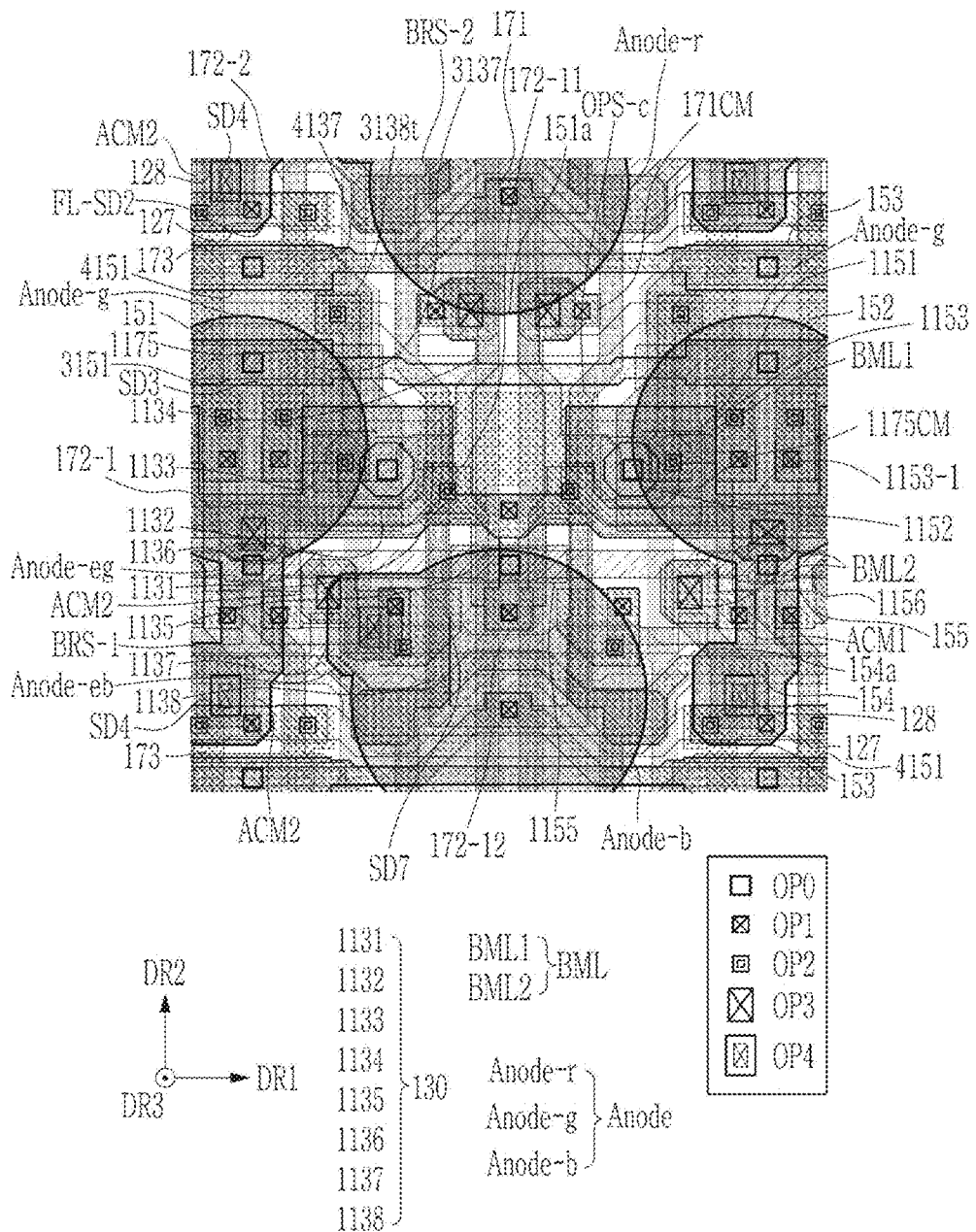

Referring to FIG. 15 and FIG. 16, the anode connection opening OP4 is formed in (e.g., penetrates) the second organic layer 182 and the third organic layer 183, through which the anode Anode and the second anode connection electrode ACM2 are electrically connected to each other.

FIG. 15 is a top plan view showing only the anode Anode and the anode connection opening OP4 for convenience and ease of comprehension, and FIG. 16 is a top plan view showing the anode Anode and various surrounding layers.

Referring to FIG. 15 and FIG. 16, the anode Anode is formed on the third organic layer 183. The anode Anode may include an anode Anode-r for a red light emitting diode LED, an anode Anode-g for a green light emitting diode LED, and an anode Anode-b for a blue light emitting diode LED.

Each anode Anode may further include an extension to receive the current from the corresponding pixel circuit through the anode connection opening OP4, and in FIG. 15 and FIG. 16, only some extensions (e.g., Anode-eg and Anode-eb) are shown. The shape and size of each anode Anode may vary from those of others, and accordingly, the extension of each anode Anode may also have various extension directions, sizes, and/or shapes.

Referring to FIG. 22, a pixel definition layer 380 is positioned on the anode Anode.

Figure 17:
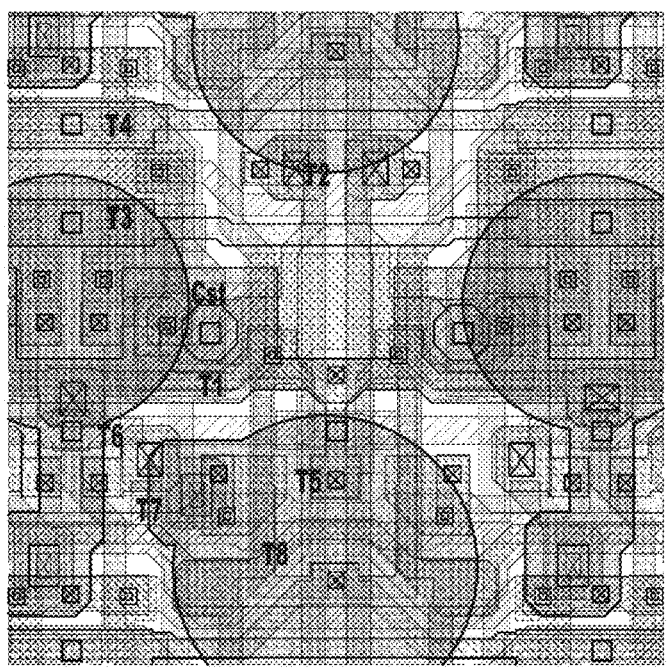
Figure 17:
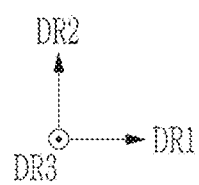

The planar structure in which the above structures are stacked as a whole is shown in FIG. 16 and FIG. 17. FIG. 17 is a view illustrating more details of the positions of the transistors and the capacitors corresponding to the circuit diagram of FIG. 3.

The stacked structure of the normal pixel is described in detail above. Hereinafter, a conductive layer structure of the component pixels positioned at (e.g., in or on) the component area EA is described in more detail with reference to FIG. 18 through FIG. 21, which may be different from that of the stacked structure of the normal pixel described above.

FIG. 18 through FIG. 21 are views illustrating a structure of a layer in which a pixel positioned at (e.g., in or on) a component area EA of a light emitting display device according to an embodiment may be different from a pixel at (e.g., in or on) a normal display area.

The component pixel according to the present embodiment may be different from the shape of the second data conductive layer, and may have the same or substantially the same structure as that of the normal pixel until the lower organic layer opening OP3 is formed at (e.g., in or on) the first organic layer 181. Therefore, the component pixel may have the same or substantially the same structure as that of the normal pixel described above with reference to FIG. 4 through FIG. 12. Accordingly, redundant description of the metal layer, the first semiconductor layer, the first gate conductive layer, the second gate conductive layer, the oxide semiconductor layer, the third gate conductive layer, the first data conductive layer, the insulating layers positioned therebetween, and the openings OP0, OP1, OP2, and OP3 positioned in the insulating layers, which are also included in the component pixel, are not repeated.

Referring to FIG. 12, the first organic layer 181 is positioned on the first data conductive layer, and the lower organic layer opening OP3 is positioned in the first organic layer 181. The lower organic layer opening OP3 exposes the part of the first driving voltage line 172-1 of the first data conductive layer, the data line connection electrode 171CM, and the first anode connection electrode ACM1.

Figure 18:
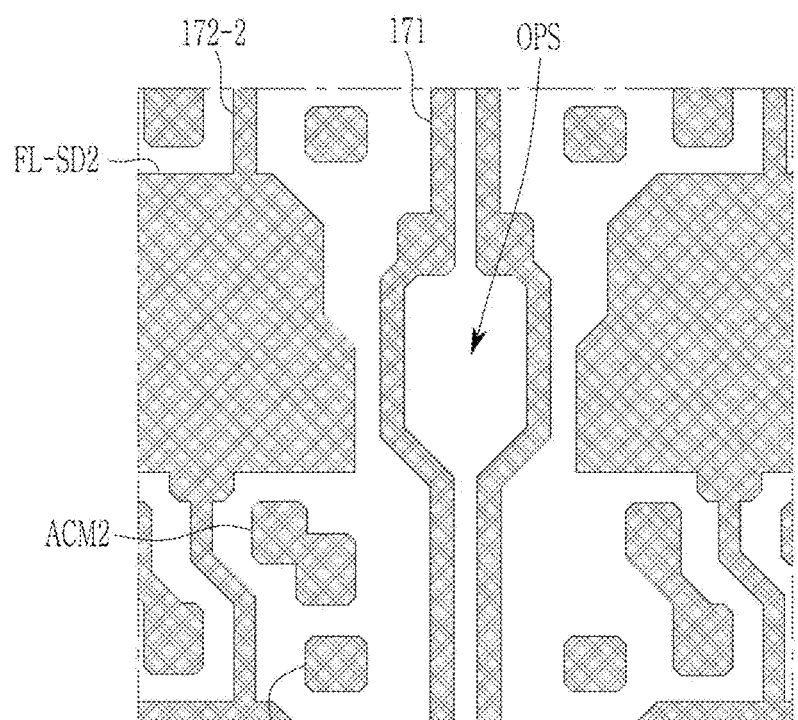
FIG. 18-FIG. 21 are views illustrating a structure of a layer in which a pixel positioned in a component area EA of a light emitting display device according to an embodiment is different from a pixel in a normal display area.
Figure 19:
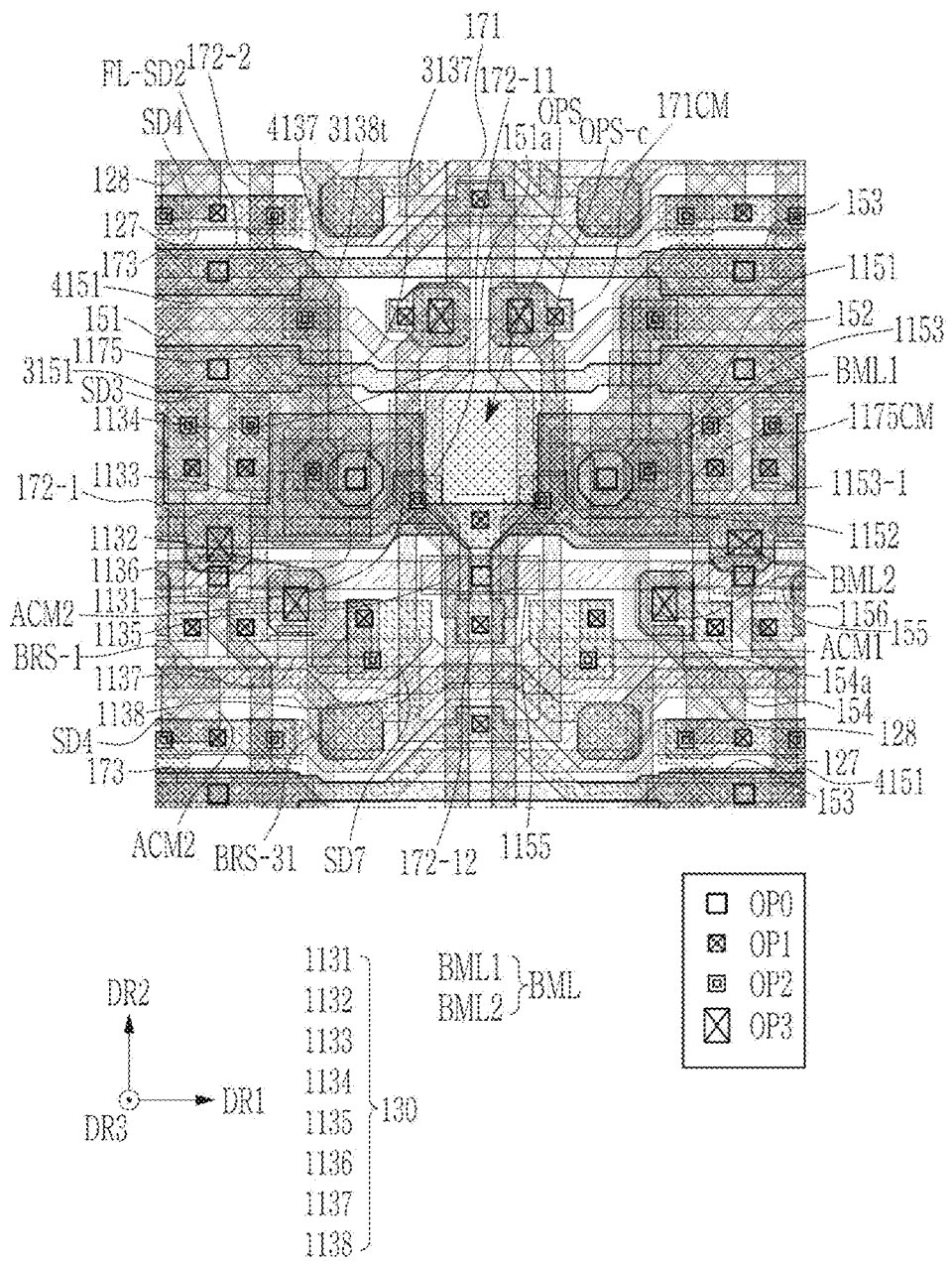

FIG. 18 is a top plan view showing only the second data conductive layer for convenience and ease of comprehension, and FIG. 19 is a top plan view showing the second data conductive layer and various surrounding layers.

Referring to FIG. 18 and FIG. 19, the second data conductive layer including the data line 171, the second driving voltage line 172-2, and the second anode connection electrode ACM2 may be positioned on the first organic layer 181. Unlike the second data conductive layer of the normal pixel, the second auxiliary data line BRS-2 may not be formed. Instead, an additional auxiliary connection part BRS-31 having an island-like structure may be formed in the second data conductive layer of the component pixel. The additional auxiliary connection part BRS-31 may be formed to overlap with the extension part of the first auxiliary data line BRS-1 of the first data conductive layer.

The data line 171 of the component pixel has a structure that is symmetrically or substantially symmetrically bent together with the adjacent data line 171, and the photosensor area OPS is positioned in the symmetrically or substantially symmetrically bent parts thereof. Referring to FIG. 13, the data line 171 of the normal pixel extends in the second direction DR2, and has a structure that is not bent, such that a pair of data lines 171 face each other, while the second auxiliary data line BRS-2 is positioned on opposite sides of the pair of data lines 171, respectively. However, the second auxiliary data line BRS-2 may not be included in the component pixel.

The structure of the second driving voltage line 172-2 and the second anode connection electrode ACM2 may have the same or substantially the same shape as that of the second data conductive layer of the normal pixel, but unlike the data line 171 of the normal pixel, the data line 171 of the component pixel may be bent, so that the photosensor area OPS may be arranged in the center thereof. The second auxiliary data line BRS-2 is not formed in order to provide a space for the data line 171 to be bent. According to an embodiment, however, if there is sufficient space, the second auxiliary data line BRS-2 may be further included.

The photosensor area OPS is a region that may detect or photograph the front of the display panel and the optical element ES positioned on the rear surface of the display panel. In the photosensor area OPS, an opaque metal or the first semiconductor layer may not be positioned, and the insulating layer, such as the inorganic insulating layer or the organic insulator, may be positioned, or the oxide semiconductor layer or the transparent conductive material, such as ITO or IZO, may be positioned. Referring to FIG. 8 and FIG. 18, in the photosensor area OPS, the shielding layer OPS-c positioned in the oxide semiconductor layer is positioned, and the substrate 110 and a plurality of insulating layers are positioned above or below the shielding layer OPS-c, so that the optical element ES positioned on the rear surface may send light to the front of the display panel, and then detect the reflected light. One optical element ES may include a light emitting part and a light receiving part. One optical element ES may detect light by using a plurality of photosensor areas OPS, such that a part of the plurality of photosensor areas OPS is used to send light to the front side of the display panel, and another part of the plurality of photosensor areas OPS is used to detect light reflected from the front.

Referring to FIG. 22, the second organic layer 182 and the third organic layer 183 are positioned on the second data conductive layer. Referring to FIG. 20, the second organic layer 182 and the third organic layer 183 include the anode connection opening OP4, thereby, the anode Anode and the second anode connection electrode ACM2 are electrically connected to each other.

Referring to FIG. 22, the pixel definition layer 380 is positioned on the anode Anode.

Figure 21:
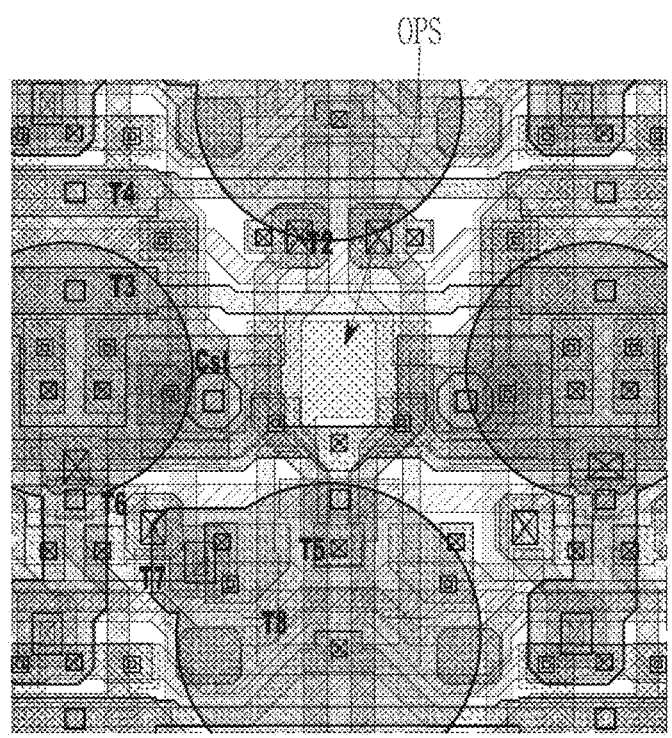
Figure 22:
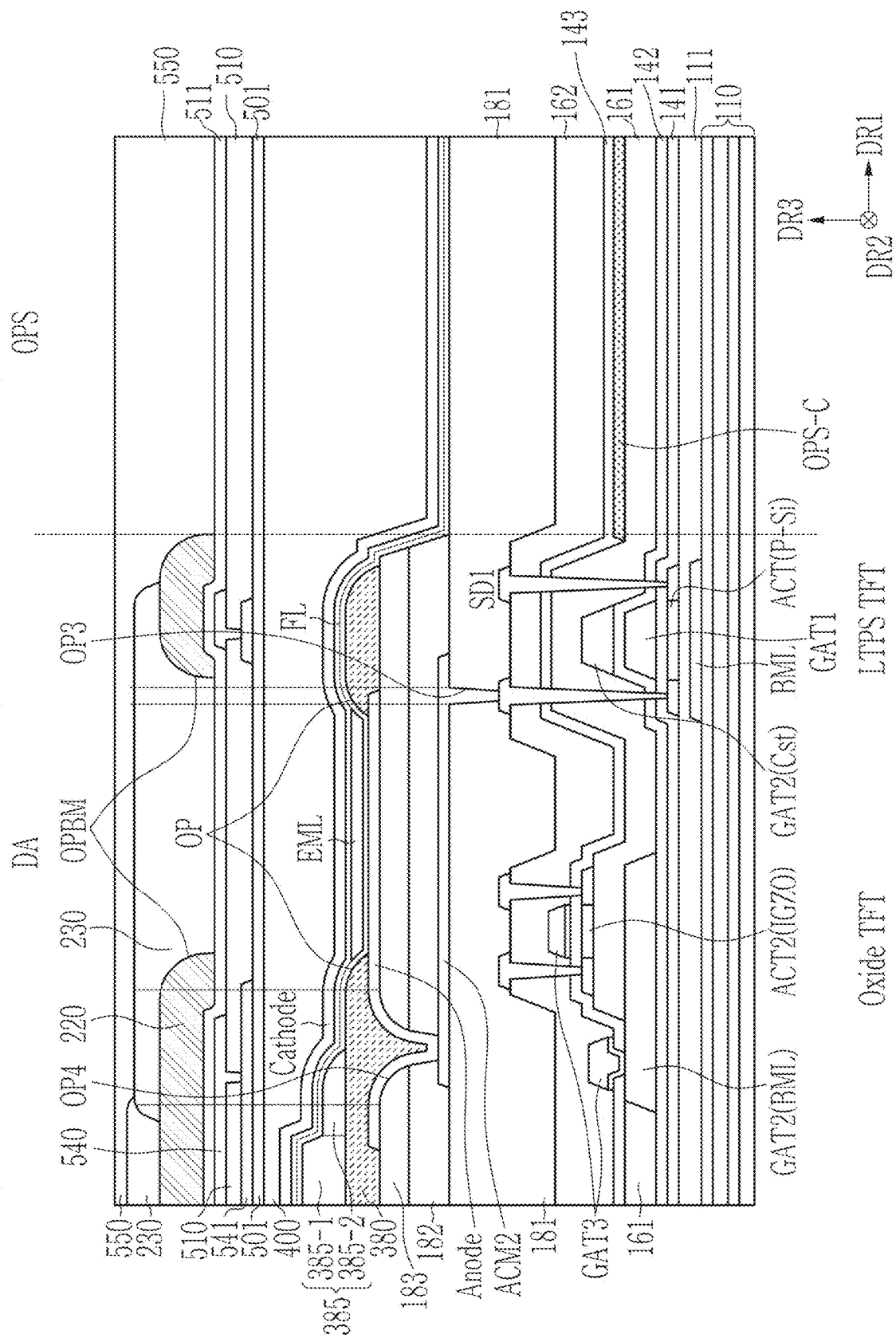
FIG. 22 is a cross-sectional view of a light emitting display device according to an embodiment.

A planar structure in which the above structures are stacked as a whole is shown in FIG. 20, and FIG. 21 is a view illustrating more details of the positions of the transistors and the capacitors corresponding to the circuit diagram of FIG. 3.

According to an embodiment, the first auxiliary data line BRS-1 may not be formed, unlike that of the first data conductive layer of the normal pixel. Also, according to an embodiment, the shielding layer OPS-c may not be formed, unlike that of the oxide semiconductor layer of the normal pixel.

The stacked structure of the component pixel is described in more detail above.

Hereinafter, the cross-section structure of the photosensor area OPS according to an embodiment along with the cross-section structure of the component pixel and the normal pixel are described in more detail with reference to FIG. 22.

FIG. 22 is a cross-sectional view of a light emitting display device according to an embodiment.

FIG. 22 shows that the stacked structure of the display area DA corresponds to the cross-sectional structure of the component pixel, except for the photosensor area OPS, as well as the cross-sectional structure of the normal pixel. The cross-sectional structure of the photosensor area OPS of the component pixel includes (e.g., is composed of) a transparent layer as a whole.

In FIG. 22, the cross-sectional structure of the normal pixel and the component pixel, except for the photosensor area OPS, is described in more detail as follows.

The light emitting display device may be largely divided into a lower panel layer and an upper panel layer. The lower panel layer is a part in which the light emitting diode LED and the pixel circuit part constituting the pixel are positioned, and may include up to an encapsulation layer 400 covering them. The pixel circuit part includes the second organic layer 182 and the third organic layer 183, and also includes the configuration thereunder. The light emitting diode LED includes the configuration positioned above the third organic layer 183, and below the encapsulation layer 400. The structure positioned above the encapsulation layer 400 may correspond to the upper panel layer. According to an embodiment, the third organic layer 183 may be omitted as needed or desired.

Referring to FIG. 22, the metal layer BML is positioned on the substrate 110.

The substrate 110 may include a material that does not bend due to a rigid characteristic, such as glass, or a flexible material that may be bent, such as plastic or polyimide. In the case of the flexible substrate, as shown in FIG. 22, the substrate 110 may have a structure including a double-layered structure of polyimide, and a barrier layer formed of an inorganic insulating material thereon.

The metal layer BML may be formed at the position overlapping with the channel of the driving transistor T1 in a plan view from among the first semiconductor layer, and is also referred to as a lower shielding layer. The metal layer BML may include a metal, such as copper (Cu), molybdenum (Mo), aluminum (Al), titanium (Ti), or a metal alloy.

On the substrate 110 and the metal layer BML, a buffer layer 111 covering them is positioned. The buffer layer 111 serves to block penetration of impurity elements into the first semiconductor layer ACT (P—Si), and may be an inorganic insulating layer including a silicon oxide (SiOx), a silicon nitride (SiNx), a silicon oxynitride (SiOxNy), or the like.

On the buffer layer 111, the first semiconductor layer ACT1 (P—Si) formed of a silicon semiconductor (e.g., a polycrystalline semiconductor (P—Si)) is positioned. The first semiconductor layer ACT1 (P—Si) includes a channel of a polycrystalline transistor LTPS TFT including the driving transistor T1, and a first region and a second region positioned on respective sides thereof. Here, the polycrystalline transistor LTPS TFT may include not only the driving transistor T1, but also the second transistor T2, the fifth transistor T5, the sixth transistor T6, the seventh transistor T7, and the eighth transistor T8. In addition, sides of the channel of the first semiconductor layer ACT1(P—Si) have a region having a conductive layer characteristic by plasma treatment or doping, so that they may serve as the first electrode and the second electrode of the corresponding transistor.

A first gate insulating layer 141 may be positioned on the first semiconductor layer ACT1 (P—Si). The first gate insulating layer 141 may be an inorganic insulating layer including a silicon oxide (SiOx), a silicon nitride (SiNx), a silicon oxynitride (SiONx), or the like.

A first gate conductive layer including the gate electrode GAT1 of the polycrystalline transistor LTPS TFT may be positioned on the first gate insulating layer 141. In the first gate conductive layer, a first scan line or a light emitting control line may be formed, in addition to the gate electrode GAT1 of the polycrystalline transistor LTPS TFT. The first gate conductive layer may include a metal, such as copper (Cu), molybdenum (Mo), aluminum (Al), titanium (Ti), or a metal alloy, and may be configured as a single layer or multiple layers.

After forming the first gate conductive layer, plasma treatment or a doping process is performed to make the exposed regions of the first semiconductor layer conductive. In other words, the first semiconductor layer ACT1 (P—Si) covered by the first gate conductive layer is not conductive, and the portion of the first semiconductor layer ACT1 (P—Si) not covered by the first gate conductive layer may have the same or substantially the same characteristics as that of the conductive layer.

A second gate insulating layer 142 may be positioned on the first gate conductive layer GAT1 and the first gate insulating layer 141. The second gate insulating layer 142 may be an inorganic insulating layer including a silicon oxide (SiOx), a silicon nitride (SiNx), a silicon oxynitride (SiONx), or the like.

On the second gate insulating layer 142, a second gate conductive layer GAT2 including one electrode GAT2(Cst) of the storage capacitor Cst and a lower shielding layer GAT2(BML) of the oxide transistor Oxide TFT may be positioned. The lower shielding layer GAT2 (BML) of the oxide transistor Oxide TFT is positioned below (e.g., underneath) the channel of the oxide transistor Oxide TFT, and may serve to shield from optical or electromagnetic interference provided to the channel from the lower side thereof. One electrode GAT2(Cst) of the storage capacitor Cst overlaps with the gate electrode GAT1 of the driving transistor T1 to form the storage capacitor Cst. According to an embodiment, the second gate conductive layer GAT2 may further include a scan line, a control line, or a voltage line. The second gate conductive layer GAT2 may include a metal, such as copper (Cu), molybdenum (Mo), aluminum (Al), titanium (Ti), or a metal alloy, and may be configured as a single layer or multiple layers.

A first interlayer insulating layer 161 may be positioned on the second gate conductive layer GAT2. The first interlayer insulating layer 161 may include an inorganic insulating layer including a silicon oxide (SiOx), a silicon nitride (SiNx), a silicon oxynitride (SiONx), and the like, and according to an embodiment, the inorganic insulating material may be formed to be thicker.

On the first interlayer insulating layer 161, an oxide semiconductor layer ACT2(IGZO) (also referred to as a second semiconductor layer) including a channel of an oxide transistor Oxide TFT, a first region, and a second region may be positioned.

A third gate insulating layer 143 may be positioned on the oxide semiconductor layer ACT2(IGZO). The third gate insulating layer 143 may be positioned on the entire surface of the oxide semiconductor layer ACT2(IGZO) and the first interlayer insulating layer 161. The third gate insulating layer 143 may include an inorganic insulating layer including a silicon oxide (SiOx), a silicon nitride (SiNx), a silicon oxynitride (SiONx), or the like.

On the third gate insulating layer 143, a third gate conductive layer GAT3 including the gate electrode of the oxide transistor Oxide TFT may be positioned. The gate electrode of the oxide transistor Oxide TFT may overlap with the channel. The third gate conductive layer GAT3 may further include a scan line or a control line. The third gate conductive layer GAT3 may include a metal or a metal alloy, such as copper (Cu), molybdenum (Mo), aluminum (Al), or titanium (Ti), and may be configured as a single layer or multiple layers.

After forming the third gate conductive layer GAT3, plasma treatment or a doping process is performed to make the exposed region of the oxide semiconductor layer ACT2 (IGZO) conductive. In other words, the oxide semiconductor layer ACT2 (IGZO) covered by the third gate conductive layer GAT3 is not conductive, and the part of the oxide semiconductor layer ACT2 (IGZO) not covered by the third gate conductive layer GAT3 may have the same or substantially the same characteristics as those of the conductive layer.

A second interlayer insulating layer 162 may be positioned on the third gate conductive layer GAT3. The second interlayer insulating layer 162 may have a single-layer or multi-layered structure. The second interlayer insulating layer 162 may include an inorganic insulating material, such as a silicon nitride (SiNx), a silicon oxide (SiOx), or a silicon oxynitride (SiOxNy), and may include an organic material according to an embodiment.

On the second interlayer insulating layer 162, a first data conductive layer SD1 including a connection electrode capable of being connected to the first region and the second region of each of the polycrystalline transistor LTPS TFT and the oxide transistor oxide TFT may be positioned. The first data conductive layer SD1 may include a metal or a metal alloy, such as copper (Cu), molybdenum (Mo), aluminum (Al), or titanium (Ti), and may be configured of a single layer or multiple layers.

The first organic layer 181 may be positioned on the first data conductive layer SD1. The first organic layer 181 may be an organic insulator including an organic material, and the organic material may include at least one material selected from the group consisting of polyimide, polyamide, acryl resin, benzocyclobutene, and phenol resin.

A second data conductive layer including the second anode connection electrode ACM2 may be positioned on the first organic layer 181. The second data conductive layer may include a data line or a driving voltage line. The second data conductive layer SD2 may include a metal or a metal alloy, such as aluminum (Al), copper (Cu), molybdenum (Mo), or titanium (Ti), and may be configured of a single layer or multiple layers.

A second organic layer 182 and a third organic layer 183 are positioned on the second data conductive layer, and an anode connection opening OP4 is formed in (e.g., penetrates) the second organic layer 182 and the third organic layer 183. The second anode connection electrode ACM2 is electrically connected to the anode Anode through the anode connection opening OP4. The second organic layer 182 and the third organic layer 183 may be an organic insulator, and may include at least one material selected from the group consisting of polyimide, polyamide, acryl resin, benzocyclobutene, and phenol resin. According to an embodiment, the third organic layer 183 may be omitted.

On the anode Anode, a pixel definition layer 380 covering at least part of the anode Anode, while having an opening OP exposing the anode Anode, may be positioned. The pixel definition layer 380 may be a black pixel definition layer formed of an organic material with a black color, so that light applied from the outside is not reflected back to the outside, and according to an embodiment, it may be formed of a transparent organic material.

A spacer 385 is positioned on the pixel definition layer 380. Unlike the pixel definition layer 380, the spacer 385 may be formed of a transparent organic insulating material. According to an embodiment, the spacer 385 may be formed of a positive-type transparent organic material.

On the anode Anode, the spacer 385, and the pixel definition layer 380, a functional layer FL and a cathode Cathode are sequentially formed. In the display area DA and the component area EA, the functional layer FL and the cathode Cathode may be positioned over the entire area. The emission layer EML is positioned between the functional layers FL, and the emission layer EML may be positioned only within the opening OP of the pixel definition layer 380.

Hereinafter, a combination of the functional layer FL and the emission layer EML may be referred to as an intermediate layer. The functional layer FL may include at least one of an auxiliary layer, such as an electron injection layer, an electron transport layer, a hole transport layer, or a hole injection layer. The hole injection layer and/or the hole transport layer may be positioned under the emission layer EML, and the electron transport layer and/or the electron injection layer may be positioned above the emission layer EML. An encapsulation layer 400 is positioned on the cathode Cathode. The encapsulation layer 400 may include at least one inorganic layer, and at least one organic layer. According to an embodiment, the encapsulation layer may have a triple-layered structure including a first inorganic encapsulation layer, an organic encapsulation layer, and a second inorganic encapsulation layer. The encapsulation layer 400 may be for protecting the emission layer EML from moisture and/or oxygen that may be inflowed from the outside. According to an embodiment, the encapsulation layer 400 may include a structure in which an inorganic layer and an organic layer are sequentially further stacked.

A sensing insulating layer 501, 510, and 511, and a plurality of sensing electrodes 540 and 541 for touch sensing are positioned on the encapsulation layer 400. In the embodiment illustrated in FIG. 22, a touch may be sensed as a capacitive type using two sensing electrodes 540 and 541.

In more detail, the first sensing insulating layer 501 is formed on the encapsulation layer 400, and the plurality of sensing electrodes 540 and 541 are formed thereon. The plurality of sensing electrodes 540 and 541 may be insulated from each other via the second sensing insulating layer 510 interposed therebetween, and portions thereof may be electrically connected to each other through the opening positioned at (e.g., in or on) the sensing insulating layer 510. The sensing electrodes 540 and 541 include a metal or metal alloy, such as aluminum (Al), copper (Cu), silver (Ag), gold (Au), molybdenum (Mo), titanium (Ti), tantalum (Ta), and/or the like, and may be composed of a single layer or multiple layers. The third sensing insulating layer 511 is formed on the sensing electrode 540.

A light blocking member 220 and a color filter layer 230 may be positioned on the sensing electrode 540 and the third sensing insulating layer 511.

The light blocking member 220 may be positioned, so as to overlap with the sensing electrodes 540 and 541 on a plane (e.g., in a plan view), and not to overlap with the anode on a plane (e.g., in a plan view). This is to prevent or substantially prevent the anode Anode capable of displaying the image from being covered by the light blocking member 220 and the sensing electrodes 540 and 541.

The color filter layer 230 may be positioned on the third sensing insulating layer 511 and the light blocking member 220. The color filter layer 230 includes a red color filter that transmits red light, a green color filter that transmits green light, and a blue color filter that transmits blue light. Each color filter layer 230 may be positioned so as to overlap with the anode Anode of the light emitting diode LED on a plane (e.g., in a plan view). The light emitted from the emission layer EML may be emitted while passing through the color filter and being changed into the corresponding color.

The light blocking member 220 may be positioned between the color filter layers 230. According to an embodiment, the color filter layer 230 may be replaced with a color conversion layer, or may further include a color conversion layer. The color conversion layer may include quantum dots. Also, according to an embodiment, a reflection adjustment layer filling the opening OPBM of the light blocking member 220 may be positioned, instead of the color filter layer 230.

According to an embodiment, the light blocking member 220 and the color filter layer 230 may be omitted as needed or desired.

A planarization layer 550 covering the color filter layer 230 may be positioned on the color filter layer 230. In the present embodiment, a polarizer may not be attached on the planarization layer 550.

FIG. 22 also shows the cross-sectional structure of the photosensor area OPS.

The photosensor area OPS includes a transparent layer to allow light to pass through, and a conductive layer or first semiconductor layer may not be positioned at (e.g., in or on) the photosensor area OPS. An opening (hereinafter, also referred to as an additional opening) is formed in (e.g., penetrates) the pixel definition layer 380, the light blocking member 220, and the color filter layer 230 at the position corresponding to the photosensor area OPS, thereby, having a structure that does not block light.

In other words, the conductive layer including the metal that may block light, the first semiconductor layer, the light blocking member 220, and the color filter layer 230 may not be formed at (e.g., in or on) the photosensor area OPS, and in the present embodiment, the pixel definition layer 380 may also be removed. On the other hand, when the pixel definition layer 380 is formed of a transparent organic material, the pixel definition layer 380 may be further positioned at (e.g., in or on) the photosensor area OPS.

In more detail, the stacked structure of the component area EA according to an embodiment is described in more detail with reference to FIGS. 20 and 22 as follows.

The buffer layer 111, which is an inorganic insulating layer, is positioned on the substrate 110, and the first gate insulating layer 141 and the second gate insulating layer 142, which are inorganic insulating layers, are sequentially positioned thereon. In addition, the first interlayer insulating layer 161, which is an inorganic insulating layer, is positioned on the second gate insulating layer 142, and the shielding layer OPS-c, which is an oxide semiconductor layer processed or doped by plasma, is positioned on the first interlayer insulating layer 161. The shielding layer OPS-c overlaps with the photosensor area OPS on a plane (e.g., in a plan view). On the shielding layer OPS-c, the third gate insulating layer 143, and the second interlayer insulating layer 162 are sequentially stacked. Only the first organic layer 181 from among the organic insulators is stacked on the second interlayer insulating layer 162. However, according to an embodiment, the second organic layer 182 and/or the third organic layer 183 may be further stacked on the first organic layer 181. According to an embodiment, only one or two organic layers from among the first organic layer 181, the second organic layer 182, and the third organic layer 183, which are the organic insulators, may be formed. Therefore, the functional layer FL may be positioned on the third organic layer 183, and the cathode Cathode may be positioned thereon.

An encapsulation layer 400 is positioned on the cathode Cathode, and the sensing insulating layers 501, 510, and 511 are sequentially positioned thereon. The encapsulation layer 400 may have a triple layered structure including a first inorganic encapsulation layer, an organic encapsulation layer, and a second inorganic encapsulation layer. In addition, the sensing insulating layers 501, 510, and 511 may all be inorganic insulating layers.

The light blocking member 220 and the color filter layer 230 are not positioned on the third sensing insulating layer 511, and in the embodiment of FIG. 22, the pixel definition layer 380 is also not formed at (e.g., in or on) the photosensor area OPS. The planarization layer 550 may be positioned on the third sensing insulating layer 511.

The photosensor area OPS does not include a conductive layer or a semiconductor layer, except for the shielding layer OPS-c, which is formed of an oxide semiconductor layer and has the same or substantially the same characteristics as those of the conductor and transmits the driving voltage ELVDD. In other words, the metal layer BML, the first semiconductor layer ACT1, the first gate conductive layer GAT1, the second gate conductive layer GAT2, the third gate conductive layer GAT3, the first data conductive layer SD1, the second data conductive layer SD2, and the anode Anode are not positioned at (e.g., in or on) the photosensor area OPS. Also, the emission layer EML, and the sensing electrodes 540 and 541 are not formed at (e.g., in or on) the photosensor area OPS.

Additionally, in the photosensor area OPS, an additional opening is formed in (e.g., penetrates) the pixel definition layer 380, the light blocking member 220, and the color filter layer 230, so that the pixel definition layer 380, the light blocking member 220, and the color filter layer 230 may not be formed. However, the light blocking member 220 may be positioned if there is no problem in sensing, even if the light blocking member 220 is positioned on the entire surface as the photosensor uses a wavelength (e.g., infrared) other than the visible rays.

According to an embodiment, the shielding layer OPS-c may be formed of a material other than an oxide semiconductor, so long as it has a transparent characteristic and a conductivity characteristic. For example, the shielding layer OPS-c may be formed of a transparent conductive material, such as ITO or IZO. When the shielding layer OPS-c is formed of the transparent conductive material, the layer may be positioned above the first semiconductor layer (ACT(P—Si)) and below the second data conductive layer, thereby, blocking a parasitic capacitance that may be generated with the driving transistor T1. The shielding layer OPS-c is described in more detail below with reference to FIG. 23 through FIG. 27.

An embodiment in which a total of three organic layers are formed, and the anode connection opening is formed in the second organic layer and the third organic layer has been described above with reference to FIG. 22. However, at least two organic layers may be formed, and in this case, the anode connection opening may be positioned in an upper organic layer that is positioned farther away from the substrate, and a lower organic layer opening may be positioned in a lower organic layer.

Hereinafter, the portion shielded by the shielding layer OPS-c in the normal pixel and the component pixel, or in other words, the photosensor area OPS, is described in more detail with reference to FIG. 23 and FIG. 24.

Figure 23:
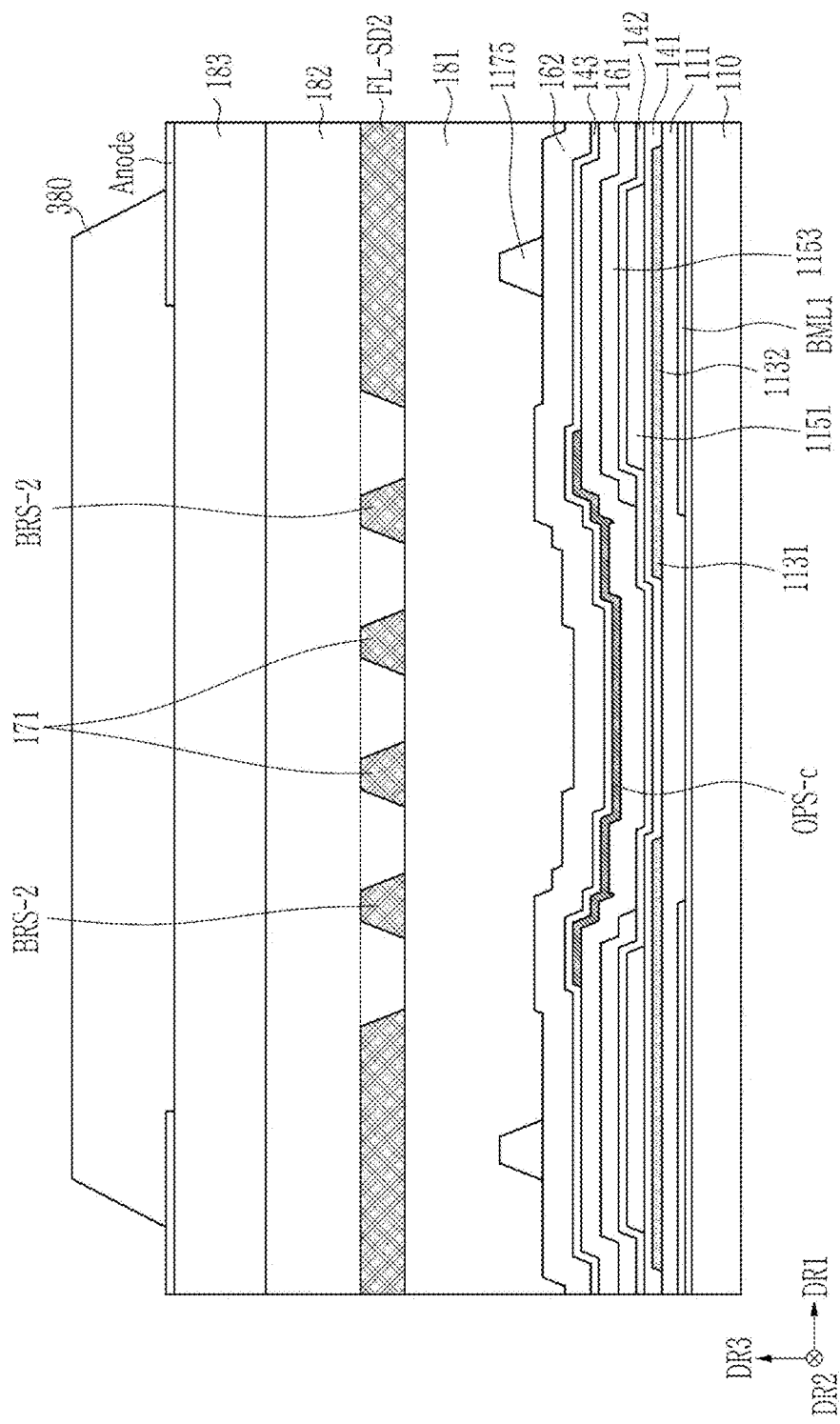
FIG. 23 and FIG. 24 are cross-sectional views illustrating more details of a shielding layer.
Figure 24:
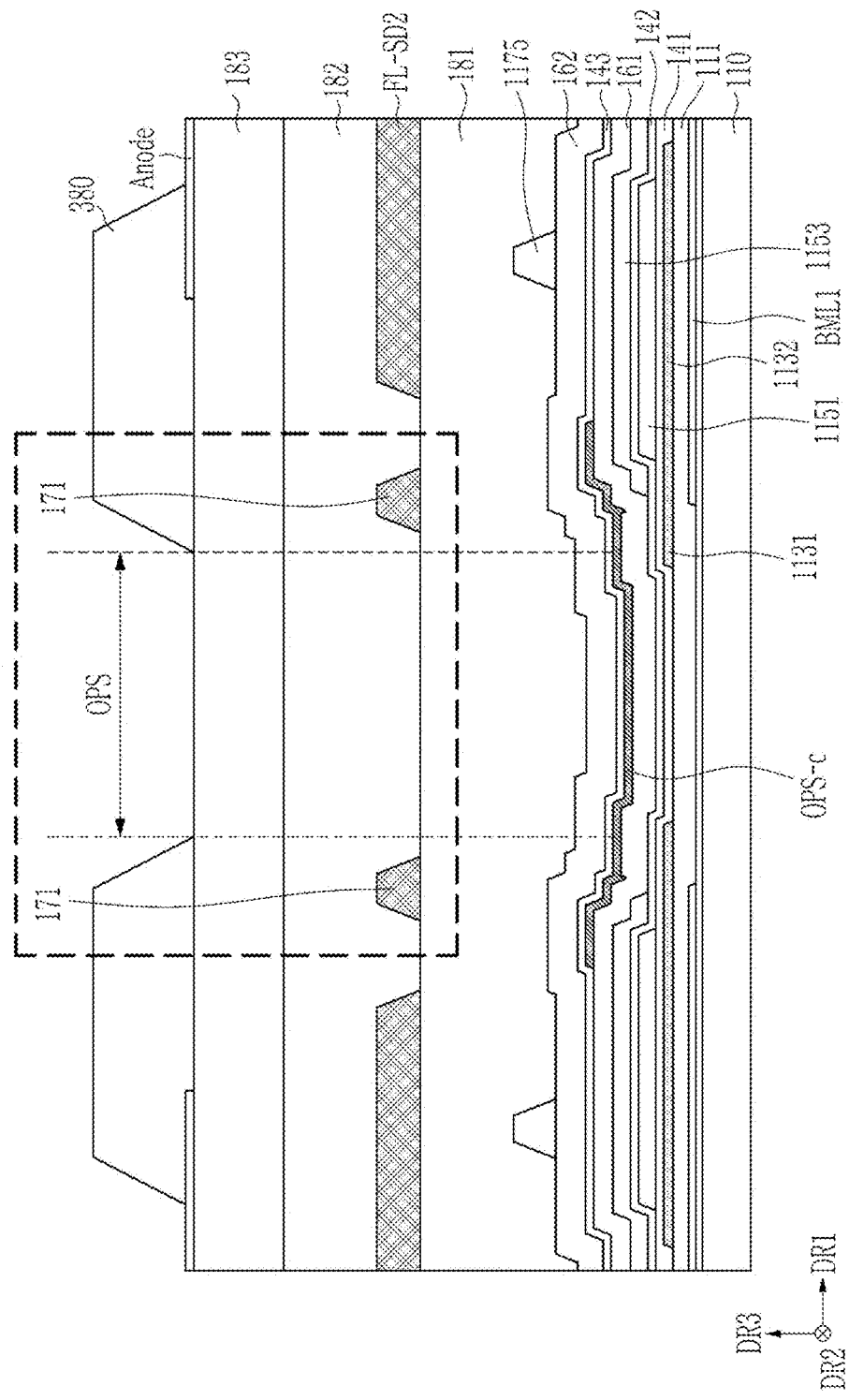

FIG. 23 and FIG. 24 are cross-sectional views illustrating more details of a shielding layer.

FIG. 23 is a cross-sectional view showing a shielding layer OPS-c in the normal pixel and an upper and lower structure thereof, and FIG. 24 is a cross-sectional view showing a shielding layer OPS-c in the component pixel and an upper and lower structure thereof.

Comparing FIG. 23 and FIG. 24, the same or substantially the same structure is formed up to the first organic layer 181.

Referring to FIG. 23 and FIG. 24, a first region 1131 of the driving transistor T1 from among the first semiconductor layer is positioned under the shielding layer OPS-c, and the first region 1131 of the driving transistor T1 serves as the source.

The upper structure on the first organic layer 181 in FIG. 23 is different from that of FIG. 24.

In FIG. 23 illustrating the normal pixel, a pair of data lines 171 and a pair of second auxiliary data lines BRS-2 are positioned on the shielding layer OPS-c, and a second organic layer 182 and a third organic layer 183 are positioned thereon. In the embodiment of FIG. 23, a pixel definition layer 380 is positioned on the third organic layer 183.

In FIG. 24 illustrating the component pixel, unlike in the normal pixel illustrated in FIG. 23, only a pair of data lines 171 (e.g., without the second auxiliary data lines BRS-2) are positioned on the shielding layer OPS-c and the first organic layer 181, and a structure (e.g., the bent structure) that secures the photosensor area OPS between (e.g., far away from) the pair of data lines 171 is formed. In this case, the second auxiliary data line BRS-2 is not positioned, and the pixel definition layer 380 is not formed on the third organic layer 183 for the photosensor area OPS. Through the structure illustrated in FIG. 24, the photosensor area OPS is sufficiently formed, so that the optical element ES positioned under the substrate 110 may be enabled to sufficiently perform the sensing operation.

In other words, because the shielding layer OPS-c of the photosensor area OPS is transparent and has a conductive characteristic, the driving voltage ELVDD is applied, so that the driving transistor T1 may not generate a parasitic capacitance with other parts.

In the structures illustrated in FIG. 23 and FIG. 24 as above-described, the shielding layer OPS-c serves to prevent or substantially prevent the first region 1131 of the driving transistor T1 serving as the source from having the parasitic capacitance with the other parts (e.g., the expansion part FL-SD2 of the second driving voltage line 172-2) to which the driving voltage ELVDD is applied.

Figure 25:
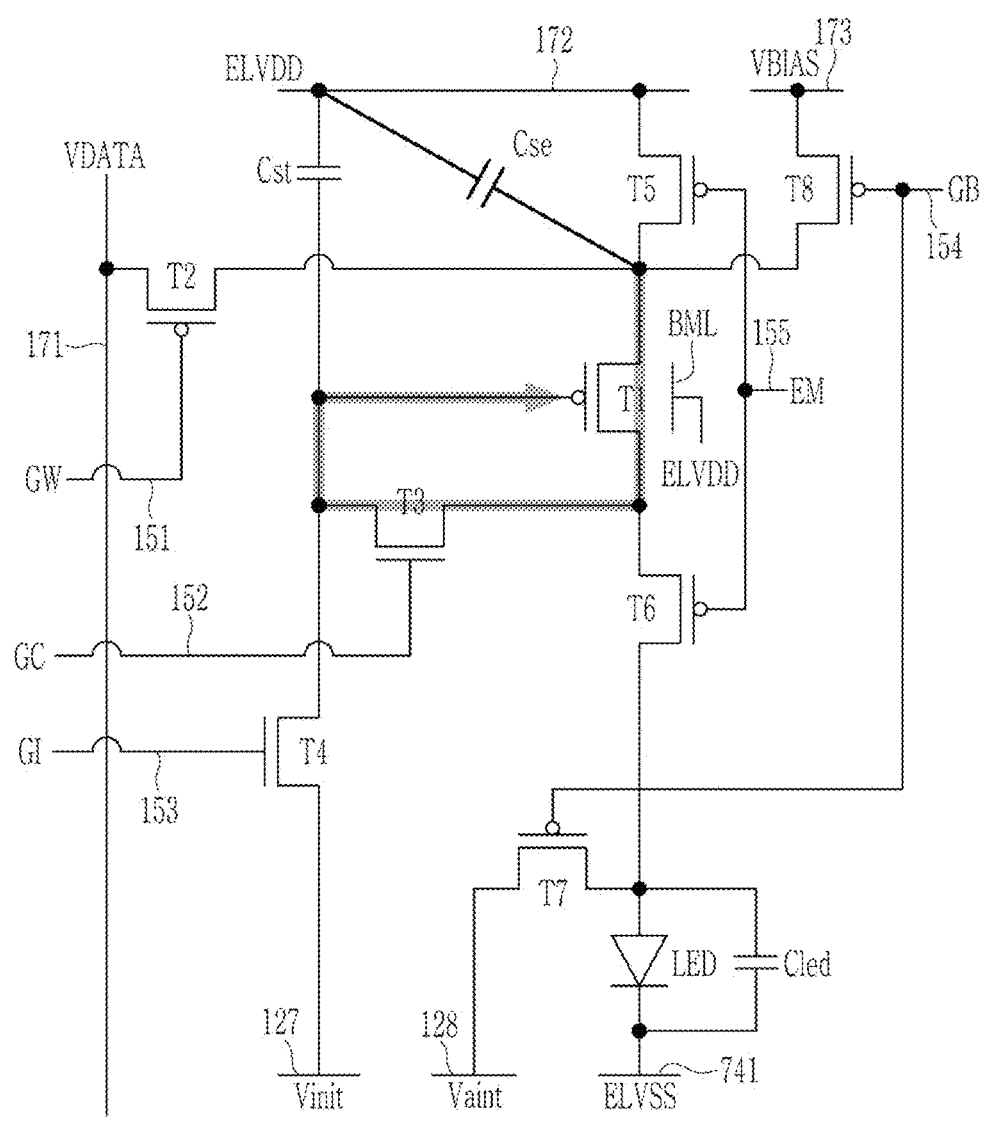
FIG. 25-FIG. 27 are views illustrating an influence generated on a driving transistor of a comparative example.

The effect for preventing or substantially preventing the first region 1131 in the driving transistor T1 from having the parasitic capacitance with the part (e.g., the expansion part FL-SD2 of the second driving voltage line 172-2) to which the driving voltage ELVDD is applied through the shielding layer OPS-c is described in more detail through a comparative example illustrated in FIG. 25.

Figure 26:
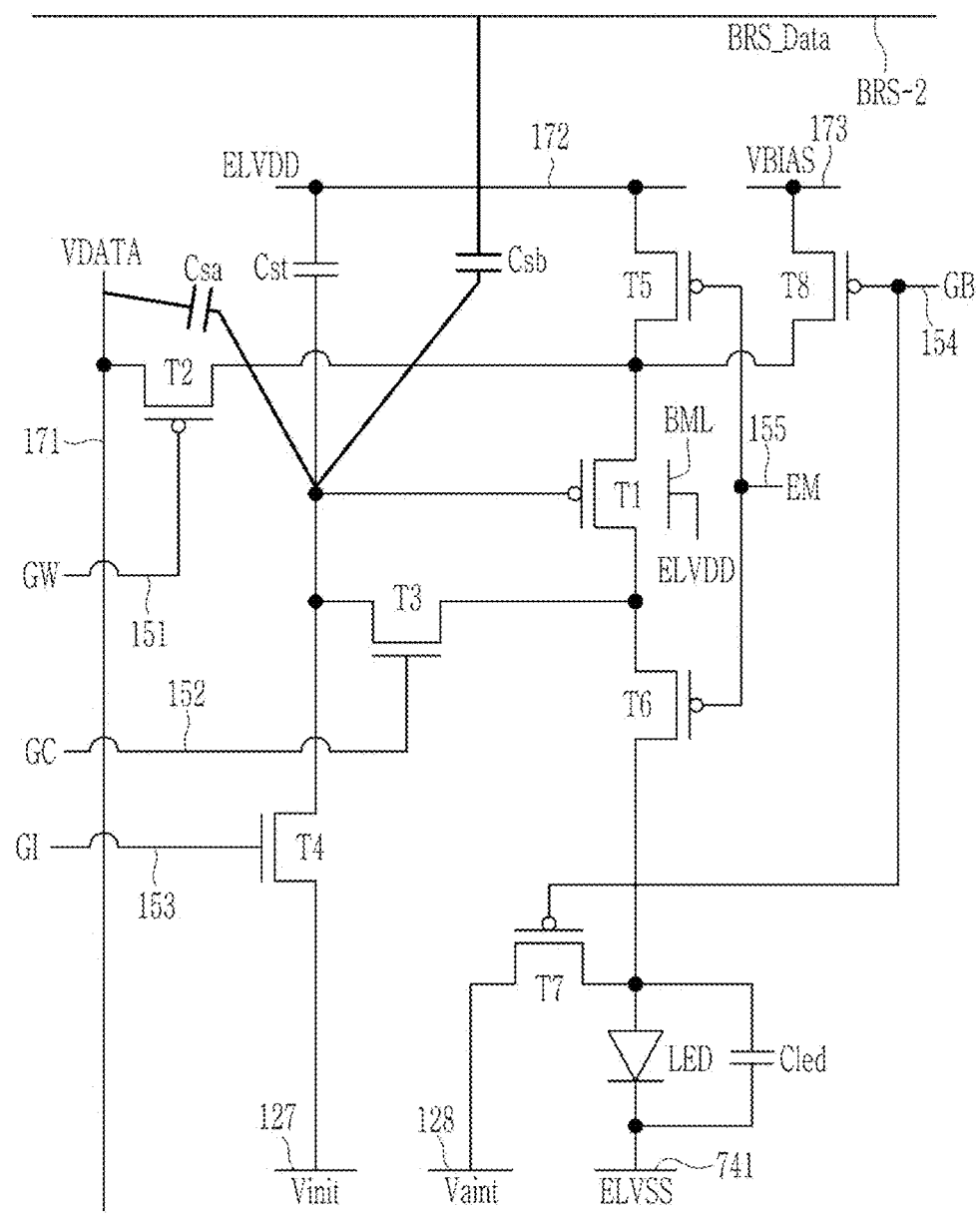
Figure 27:
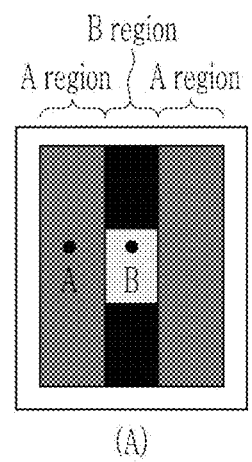
Figure 27:
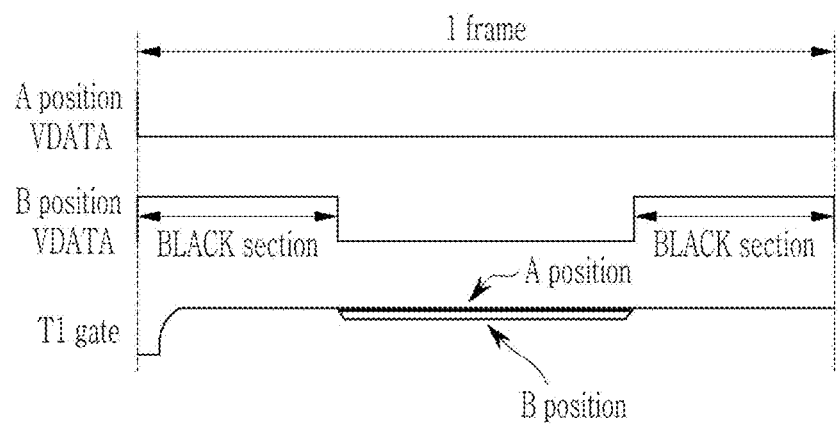

FIG. 25 through FIG. 27 are views illustrating an influence generated on a driving transistor of a comparative example.

FIG. 25 is a view illustrating an influence that occurs on a driving transistor of the comparative example.

FIG. 25 shows a circuit diagram of the comparative example, in which the shielding layer OPS-c is not included, so that a parasitic capacitor Cse is generated between the first region 1131 of the driving transistor T1 and the part (e.g., the expansion part FL-SD2 of the second driving voltage line 172-2) to which the driving voltage ELVDD is applied.

In the comparative example, in which the parasitic capacitor Cse is formed in the first region 1131 serving as the source of the driving transistor T1, as the magnitude of the generated parasitic capacitor Cse capacitance varies for different pixels (e.g., for each pixel), as shown by the arrow illustrated in FIG. 25, the data voltage VDATA that is transmitted to the driving gate electrode through the driving transistor T1 and the stored voltage values may be different from each other.

In other words, as shown in FIG. 25, the path through which the data voltage VDATA is transmitted compensates the threshold voltage of the driving transistor T1, and the compensated data voltage VDATA is stored in the driving gate electrode and the one electrode of the storage capacitor Cst. In this case, the value stored at the one electrode of the storage capacitor Cst is determined according to the difference between the voltage of the one electrode of the storage capacitor Cst, or in other words, the driving gate electrode, and the voltage value of the first region 1131 serving as the source of the driving transistor T1. However, because the voltage value of the first region 1131 of the driving transistor T1 is relatively reduced by the parasitic capacitor Cse, the value stored in the driving gate electrode of the driving transistor T1 is also changed. As a result, the voltage value of the driving gate electrode that is used to operate the driving transistor T1 in the light emitting period is changed, and the driving transistor T1 transmits the current that generates a luminance that is different from a desired luminance to the light emitting diode LED as an output current, thereby, affecting the display quality.

However, according to one or more embodiments of the present disclosure, because the shielding layer OPS-c is formed on the first region 1131 of the driving transistor T1, when the driving voltage ELVDD is applied, a parasitic capacitance of a desired magnitude (e.g., a predetermined or certain magnitude) is generated between the first region 1131 of the driving transistor T1 and the shielding layer OPS-c, thereby, performing a constant or substantially constant compensation operation for all of the pixels. As a result, it may be possible to perform a constant or substantially constant display for each pixel, and display quality may be improved.

In addition, the shielding layer OPS-c according to one or more embodiments of the present disclosure may also remove the parasitic capacitance between the wiring (e.g., the pair of data lines 171 and the pair of second auxiliary data lines BRS-2) to which the four data voltages VDATA are applied in the normal pixel and the driving gate electrode of the driving transistor T1 to improve the display quality (e.g., to make the display quality constant or substantially constant), and this effect is described in more detail through the comparative example illustrated in FIG. 26 and FIG. 27.

In the comparative example illustrated in FIG. 26, the shielding layer OPS-c is not included, so that parasitic capacitances Csa and Csb are generated in the driving gate electrode of the driving transistor T1. In more detail, a parasitic capacitance Csa is generated between the driving gate electrode of the driving transistor T1 and the data line 171, and a parasitic capacitance Csb is generated between the driving gate electrode of the driving transistor T1 and the second auxiliary data line BRS-2.

The second auxiliary data line BRS-2 is a wire that transmits a data voltage BRS_Data to be transmitted to the adjacent data line in order to reduce the area of the fan-out region, so that it is a wire to which the data voltage is applied like the data line 171. If the luminance displayed by the adjacent pixel and the corresponding pixel are different from each other, the data voltage BRS_Data flowing through the second auxiliary data line BRS-2 and the data voltage VDATA flowing through the data line 171 may have different magnitudes from each other.

The capacitance value of the parasitic capacitor Csb generated due to the data voltage BRS_Data transmitted to the adjacent pixel may be different every time, and the data voltage BRS_Data may have the voltage value that changes every moment even within one frame, so that the voltage value of the driving gate electrode is affected, and the magnitude of the current output by the driving transistor T1 is also changed.

In addition, the display quality may be reduced, even when a certain section displays the same luminance, and this is described in more detail with reference to FIG. 27.

In FIG. 27(A), a display area is divided into three regions. Two regions A display a middle gray (e.g., a middle grayscale level), and a region B is divided into three parts along a second direction DR2 that is an extension direction of the data line 171. Opposite sides in the second direction DR2 of the region B display black (e.g., a black grayscale level), and a middle part therebetween display the middle gray (e.g., the middle grayscale level) that is the same as that of the region A. However, as shown in FIG. 27(A), the middle gray displayed by the region A and the middle gray displayed by middle part positioned at the center of the region B display different luminance from each other, and the luminance displayed by the middle part of the region B is higher.

This is described in more detail with reference to FIG. 27(B).

FIG. 27(B) schematically shows a value of the data voltage VDATA at the position A from among the region A and the position B from among the region B, and a voltage waveform of a driving gate electrode T1 gate according thereto.

First, in the region A, all pixels connected to one data line display the middle gray, so the data voltage corresponding to the middle gray is continuously applied. Therefore, a constant data voltage VDATA is also applied to the data line connected to the pixel positioned at the position A of the region A.

On the other hand, in the region B, the data voltage VDATA is applied while being changed to apply the black data voltage or the data voltage of the middle gray to all pixels connected to one data line. As a result, it is divided into and applied to a section (e.g., a black section) displaying black positioned on both sides of one frame, and a section displaying the middle gray therebetween to the data line connected to the pixel positioned at the position B of the region B as shown in FIG. 27(B).

In FIG. 27(B), it may be confirmed that the voltage waveform of the driving gate electrode T1 gate shows the position A and the position B together, compared with the position A and the voltage of the driving gate electrode T1 gate of the position B that is low.

That the voltage of the driving gate electrode T1 gate in the position B is lowered, when the data voltage BRS_Data transmitted to the adjacent pixel is lowered from the black data voltage to the middle data voltage, is the reason that the driving gate electrode T1 gate connected thereto by the parasitic capacitance Csb is also lowered.

As a result, at the position B, the driving transistor T1 generates the larger current, and accordingly, the luminance of the position B is higher than that of the position A. Therefore, as shown in FIG. 27(A), the luminance displayed in the central region of the region B is higher than that in the region A.

However, according to one or more embodiments of the present disclosure, as shown in FIG. 23, because the shielding layer OPS-c prevents or substantially prevents the interference with the second auxiliary data line BRS-2 while being positioned above the first region 1131 of the driving transistor T1 and the driving gate electrode 1151, the deterioration of the display quality such as that shown in FIG. 27 may be prevented or substantially prevented.

As the component pixel may not include the second auxiliary data line BRS-2, the interference with the second auxiliary data line BRS-2 may be applied only to the normal pixels, and thus, the shielding layer OPS-c may be provided to block the interference to enable the light emitting display device to be displayed uniformly or substantially uniformly as a whole.

In other words, the component pixel does not include the second auxiliary data line BRS-2, so even if the shielding layer OPS-c is not provided, the interference like that illustrated in FIG. 27 may not be generated. However, in the normal pixel, if there is no shielding layer OPS-c, due to the second auxiliary data line BRS-2, luminance deterioration like that illustrated in FIG. 27, may occur. Therefore, in the light emitting display device including both the normal pixel and the component pixel, when the shielding layer OPS-c is not included in the normal pixel, a boundary between the normal pixel and the component pixel, or in other words, the boundary of the component area EA, may be recognized. Therefore, the shielding layer OPS-c is included in the normal pixel, such that recognition of the boundary of the component area EA may be prevented or reduced. In addition, the shielding layer OPS-c is formed according to one or more embodiments of the present disclosure in order to not change the characteristic of the driving transistor T1 even in the component pixel.

The shielding layer OPS-c according to one or more embodiments of the present disclosure may be formed of a material other than the oxide semiconductor, so long as the shielding layer OPS-c has a transparent characteristic and a conductivity characteristic. For example, the shielding layer OPS-c may be formed of a transparent conductive material, such as ITO or IZO, in addition to, or in lieu of, the doped or plasma-treated oxide semiconductor described above. When the shielding layer OPS-c is formed of the transparent conductive material, the shielding layer OPS-c may be positioned above the first semiconductor layer ACT (P—Si), and below the second data conductive layer to block the parasitic capacitance generated with the driving transistor T1.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

| Description of Symbols | |
|---|---|
| 1000: | display device |
| DA: | display area |
| DP: | display panel |
| EA: | component region |
| ES: | optical element |
| OPS: | photosensor area |
| OPS-c: | shielding layer |
| 127: | first initialization voltage line |
| 128: | second initialization voltage line |
| 151: | first scan line |
| 152: | second scan line |
| 153: | third scan line |
| 154: | fourth scan line |
| 155: | light emitting control line |
| 171: | data line |
| 172, 172-1, 172-2: | driving voltage line |
| 173: | bias voltage line |
| 741: | common voltage line |
| T1, T2, T3, T4, T5, T6, T7, T8: | transistor |
| LED: | light emitting diode LED |
| Cst: | storage capacitor |
| Cled: | diode capacitor |
| Csa, Csb, Cse: | parasitic capacitor |
| BRS, BRS-1, BRS-2: | auxiliary data line |
| BRS-31: | additional auxiliary connection part |
| 130, ACT (P-Si): | first semiconductor layer |
| 1131: | first region of driving transistor |
| 1132: | channel of driving transistor |
| 1133: | second region of driving transistor |
| 1151: | driving gate electrode |
| 1152: | opening |
| 1153: | first storage electrode |
| ACT2 (IGZO): | oxide semiconductor layer |
| 3137: | third transistor channel |
| 3138t: | expansion part |
| 3151: | third transistor gate electrode |
| 4137: | fourth transistor channel |
| 4151: | fourth transistor gate electrode |
| 1175, SD3, SD4, SD7: | connection electrode |
| 1175CM: | connection electrode for driving gate electrode |
| 171CM: | data line connection electrode |
| ACM1, ACM2: | anode connection electrode |
| Anode: | anode |
| Cathode: | cathode |
| EML: | emission layer |
| FL: | functional layer |
| FL-SD2: | expansion part |
| BML, BML1, BML2: | metal layer |
| 110: | substrate |
| 111: | buffer layer |
| 141: | first gate insulating layer |
| 142: | second gate insulating layer |
| 143: | third gate insulating layer |
| 161: | first interlayer insulating layer |
| 162: | second interlayer insulating layer |
| 181: | first organic layer |
| 182: | second organic layer |
| 183: | third organic layer |
| OP0, OP1, OP2, OP3: | opening |
| OP4: | anode connection opening |
| OPBM: | opening of light blocking member |
| 220: | light blocking member |
| 230: | color filter layer |
| 380: | pixel definition layer |
| 385: | spacer |
| 400: | encapsulation layer |
| 501, 510, 511: | sensing insulating layer |
| 540, 541: | sensing electrode |
| 550: | planarization layer |
| 50: | the driving part 50 |
| WU: | cover window |

What is claimed is:

1. A light emitting display device comprising:
a display panel comprising:
a display area; and
a first pixel and a second pixel at the display area; and
an optical element on a rear surface of the second pixel,
wherein the first pixel comprises:
a first semiconductor layer on a substrate;
a first gate conductive layer on the first semiconductor layer;
a second gate conductive layer on the first gate conductive layer;
an oxide semiconductor layer on the second gate conductive layer, and comprising a shielding layer;
a third gate conductive layer on the oxide semiconductor layer;
a first data conductive layer on the third gate conductive layer; and
a second data conductive layer on the first data conductive layer,
wherein the second data conductive layer of the first pixel comprises a data line, and a main auxiliary data line extending in a direction parallel to that of the data line,
wherein the second pixel comprises:
the first semiconductor layer on the substrate;
the first gate conductive layer on the first semiconductor layer;
the second gate conductive layer on the first gate conductive layer;
the oxide semiconductor layer on the second gate conductive layer, and comprising the shielding layer;
the third gate conductive layer on the oxide semiconductor layer;
the first data conductive layer on the third gate conductive layer; and
the second data conductive layer on the first data conductive layer, and
wherein the second data conductive layer of the second pixel comprises a data line, and does not include a main auxiliary data line.

2. The light emitting display device of claim 1, wherein the shielding layer is transparent and conductive.

3. The light emitting display device of claim 2, wherein the data line of the second pixel has a structure that is symmetrically bent together with a structure of an adjacent data line, and a photosensor area is located in an area defined by the symmetrically bent structures.

4. The light emitting display device of claim 3, wherein the data line of the first pixel extends in one direction, and has an unbent structure.

5. The light emitting display device of claim 4, wherein the data line of the first pixel comprises a pair of data lines facing each, and the main auxiliary data line is located at opposite sides of the pair of data lines.

6. The light emitting display device of claim 3, wherein the first semiconductor layer included in each of the first pixel and the second pixel includes a first region, a channel, and a second region of a corresponding driving transistor, and
wherein the shielding layer included in each of the first pixel and the second pixel overlaps with the first region of the corresponding driving transistor in a plan view.

7. The light emitting display device of claim 6, wherein the data line of the first pixel comprises a pair of data lines, the main auxiliary data line comprises a pair of main auxiliary data lines, and the shielding layer included in the first pixel overlaps with the pair of data lines and the pair of main auxiliary data lines.

8. The light emitting display device of claim 7, wherein the shielding layer included in the second pixel overlaps with the photosensor area.

9. The light emitting display device of claim 1, wherein the first data conductive layer included in the first pixel comprises an additional auxiliary data line, and the additional auxiliary data line has an extension direction crossing the extension direction of the data line and the main auxiliary data line.

10. The light emitting display device of claim 9, wherein the first data conductive layer included in the second pixel comprises an additional auxiliary data line.

* * * * *